US006339241B1

(12) United States Patent
Mandelman et al.

(10) Patent No.: US 6,339,241 B1
(45) Date of Patent: Jan. 15, 2002

(54) STRUCTURE AND PROCESS FOR 6F² TRENCH CAPACITOR DRAM CELL WITH VERTICAL MOSFET AND 3F BITLINE PITCH

(75) Inventors: Jack A. Mandelman, Stormville; Ramachandra Divakaruni, Somers; Carl J. Radens, LaGrangeville, all of NY (US); Ulrike Gruening, Munich (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/602,426

(22) Filed: Jun. 23, 2000

(51) Int. Cl.$^7$ ............................................. H01L 27/108
(52) U.S. Cl. ....................... 257/301; 257/296; 257/302; 257/303; 257/304; 257/305; 438/438; 438/242; 438/248; 438/282; 438/400; 438/404
(58) Field of Search .................. 257/296, 301–305; 438/242, 248, 282, 400, 404

(56) References Cited

U.S. PATENT DOCUMENTS

| 4,830,978 A | 5/1989 | Teng et al. ............... 437/52 |
| 5,008,214 A | 4/1991 | Redwine ............... 437/52 |
| 5,107,459 A | 4/1992 | Chu et al. ............... 365/63 |
| 5,164,917 A | 11/1992 | Shichijo ............... 365/149 |
| 5,214,603 A | 5/1993 | Dhong et al. ............... 365/207 |
| 5,519,236 A | 5/1996 | Ozaki ............... 257/302 |
| 5,529,944 A | 6/1996 | Rajeevakumar ............... 438/52 |
| 6,074,909 A | * 6/2000 | Gruening ............... 438/242 |
| 6,153,902 A | * 11/2000 | Furukawa et al. ............... 257/301 |

OTHER PUBLICATIONS

Aoki et al, 1996, 1996 Symposium on VLSI Technology Digest of Technical Paper, 22–23.*

* cited by examiner

Primary Examiner—Sara Crane
Assistant Examiner—Donghee Kang
(74) Attorney, Agent, or Firm—Connelly Bove Lodge & Hutz LLP

(57) ABSTRACT

A memory cell structure including a planar semiconductor substrate. A deep trench is in the semiconductor substrate. The deep trench has a plurality of side walls and a bottom. A storage capacitor is at the bottom of the deep trench. A vertical transistor extends down at least one side wall of the deep trench above the storage capacitor. The transistor has a source diffusion extending in the plane of the substrate adjacent the deep trench. An isolation extends down at least one other sidewall of the deep trench opposite the vertical transistor. Shallow trench isolation regions extend along a surface of the substrate in a direction transverse to the sidewall where the vertical transistor extends. A gate conductor extends within the deep trench. A wordline extends over the deep trench and is connected to the gate conductor. A bitline extends above the surface plane of the substrate and has a contact to the source diffusion between the shallow trench isolation regions.

15 Claims, 33 Drawing Sheets

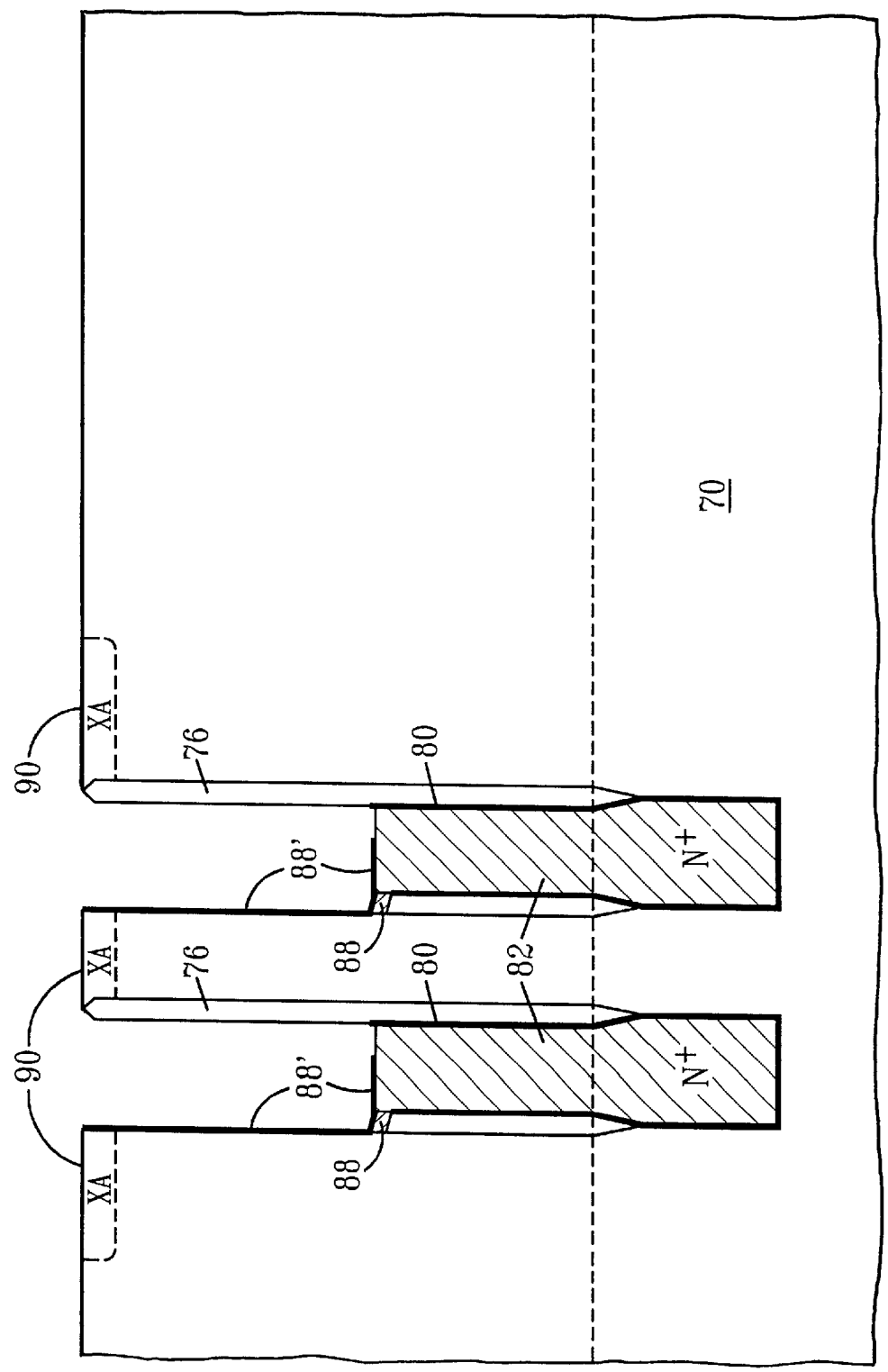

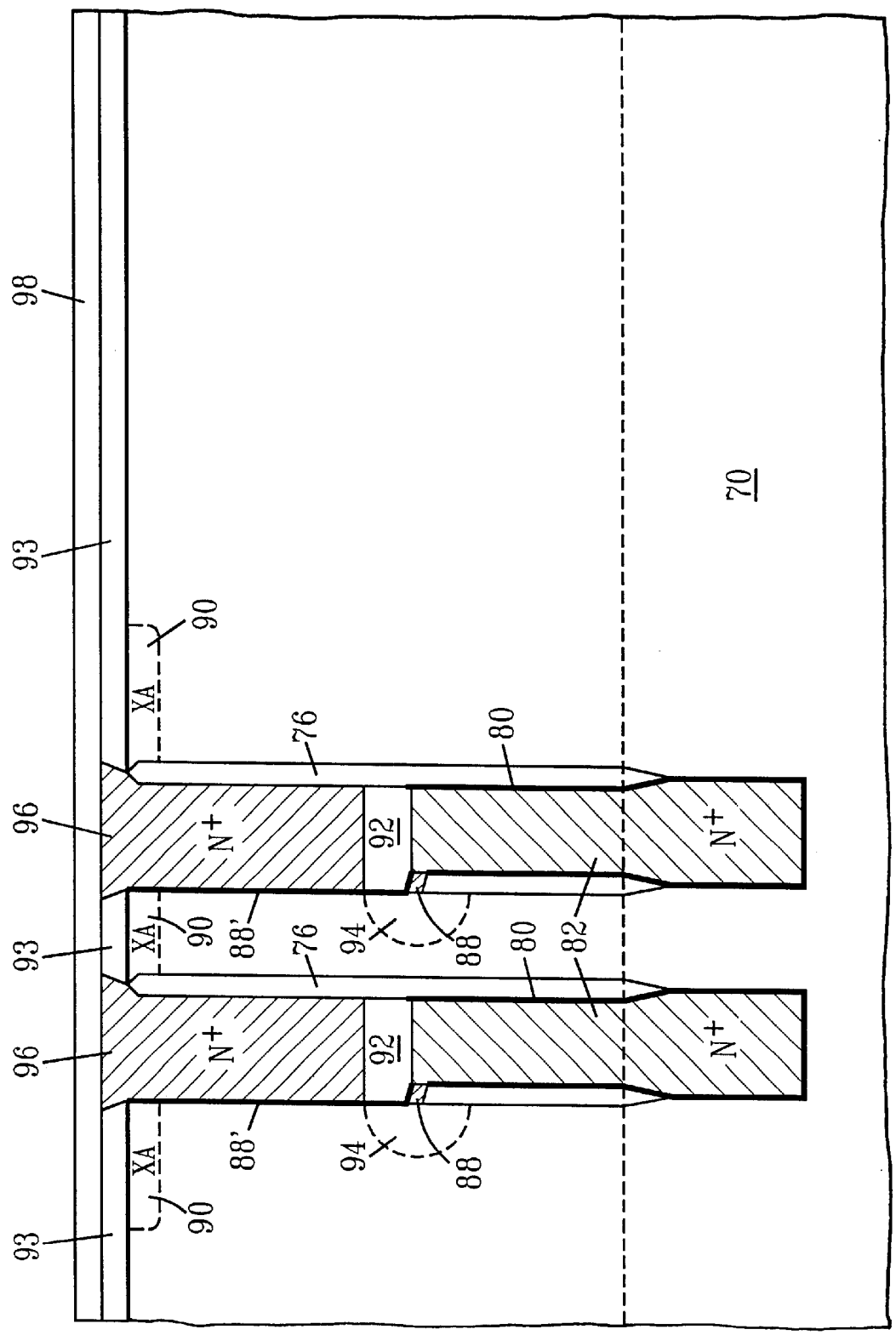

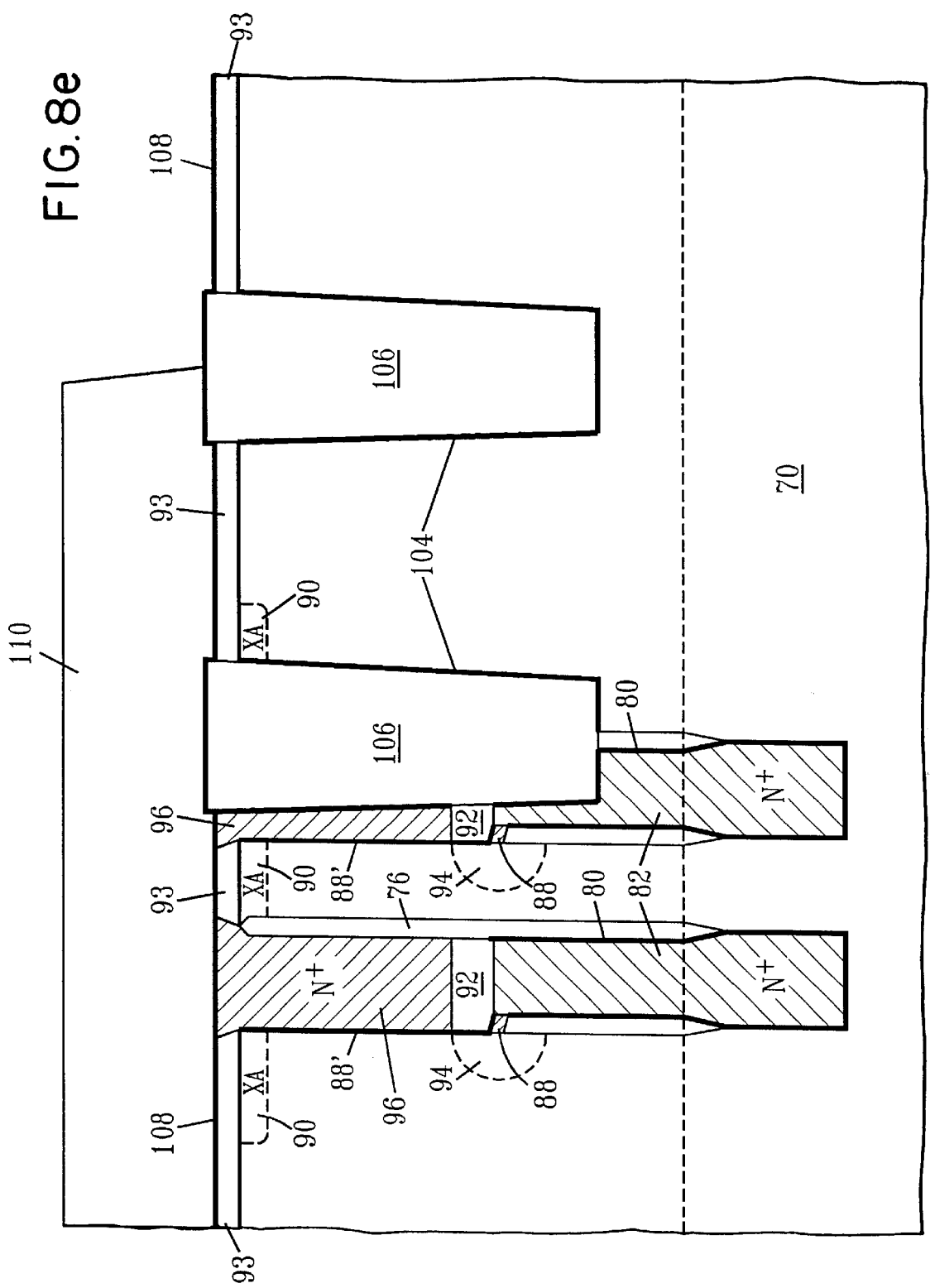

US 6,339,241 B1

STRUCTURE AND PROCESS FOR 6F² TRENCH CAPACITOR DRAM CELL WITH VERTICAL MOSFET AND 3F BITLINE PITCH

FIELD OF THE INVENTION

The invention relates to semiconductor memory structures and processes for forming semiconductor memory structures.

BACKGROUND OF THE INVENTION

Present trends in DRAM technology are constantly driving towards reduction in minimum feature size, F, and more compact cell layouts. It follows that array densities are also ever increasing. The decreasing size of memory structures as well as the increasing array density can result in problems in the fabrication of memory structures and in the operation of the memory structures. Various structures and methods have been proposed to address the manufacturing and operational problems associated with smaller and denser memory cell structures.

SUMMARY OF THE INVENTION

The present invention provides a memory cell structure. The memory cell structure includes a planar semiconductor substrate. A deep trench is arranged in the semiconductor substrate. The deep trench has a plurality of side walls and a bottom. A storage capacitor is arranged at the bottom of the deep trench. A vertical transistor extends down at least one side wall of the deep trench above the storage capacitor. The transistor has an upper source/drain diffusion and a lower source/drain diffusion extending in the plane of the substrate adjacent the deep trench. An isolation region extends down at least one other sidewall of the deep trench opposite the vertical transistor. Shallow trench isolation regions extend along a surface of the substrate in a direction transverse to the sidewall where the vertical transistor extends. A gate conductor extends within the deep trench. A wordline extends over the deep trench and connected to the gate conductor. A bitline extends above the surface plane of the substrate having a contact to the source diffusion between the shallow trench isolation regions.

Additionally, the present invention provides a process for forming a memory cell structure. A deep trench is formed having a plurality of side walls in a planar semiconductor substrate. A storage capacitor is formed at the bottom of the deep trench. A vertical transistor is formed extending down at least one side wall of the deep trench above the storage capacitor. The transistor is formed having upper source/drain diffusions and lower source/drain diffusions extending in the plane of the substrate adjacent the deep trench. An isolation region is formed extending down at least one other sidewall of the deep trench opposite the vertical transistor. Shallow trench isolation regions are formed extending along a surface of the substrate in a direction transverse to the sidewall where the vertical transistor extends. A gate conductor is formed extending within the deep trench. A wordline is formed extending over the deep trench and connected to the gate conductor. A bitline is formed extending above the surface plane of the substrate having a contact to the source diffusion between the shallow trench isolation regions.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which:

FIGS. 6*a–f*, 7*a–f*, 8*a–f*, 9*a–f*, and 10*a–d* represent cross-sectional views of an additional embodiment of a memory structure according to the present invention at various stages of another embodiment of a process for forming a memory structure according to the present invention.

DETAILED DESCRIPTION OF THE INVENTION

Figure 1:
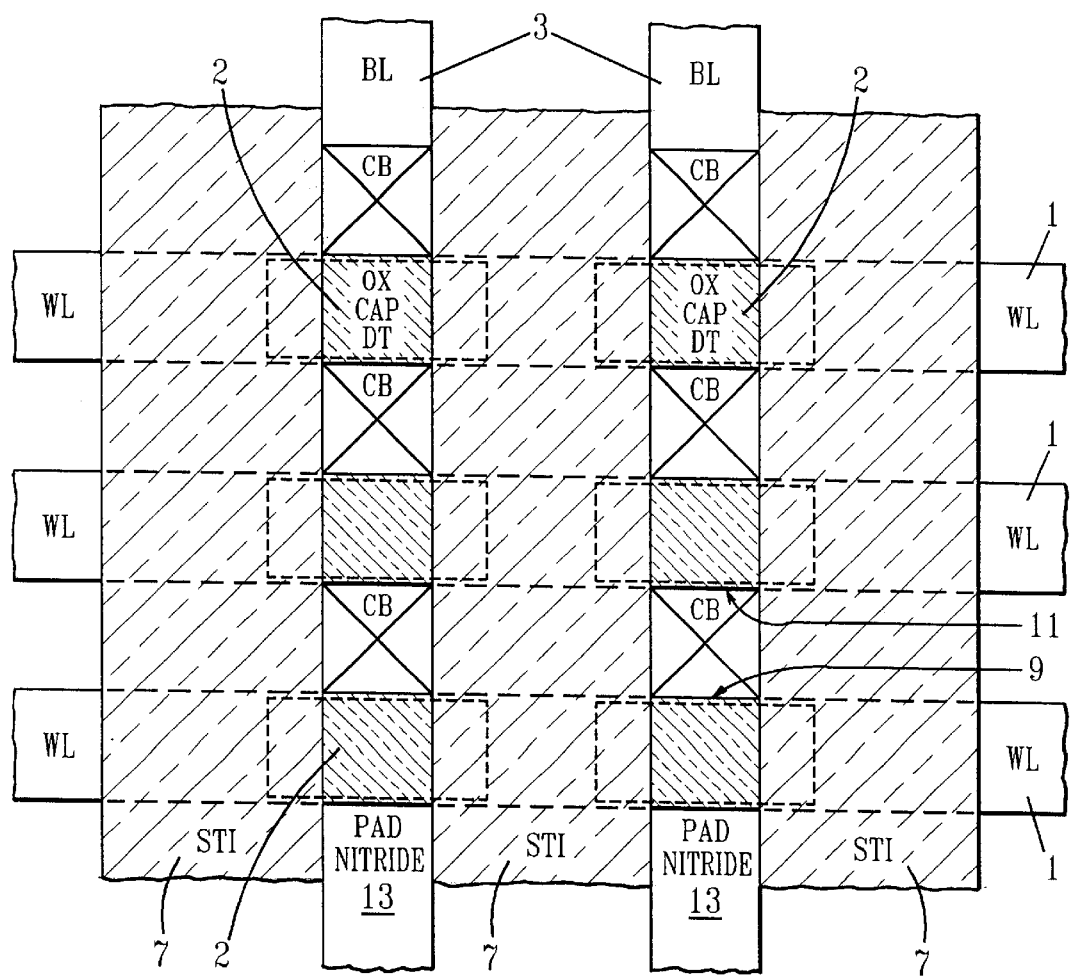
FIGS. 1, 2, and 3 represent overhead views of two embodiments of a memory array structure according to the present invention.
Figure 2:
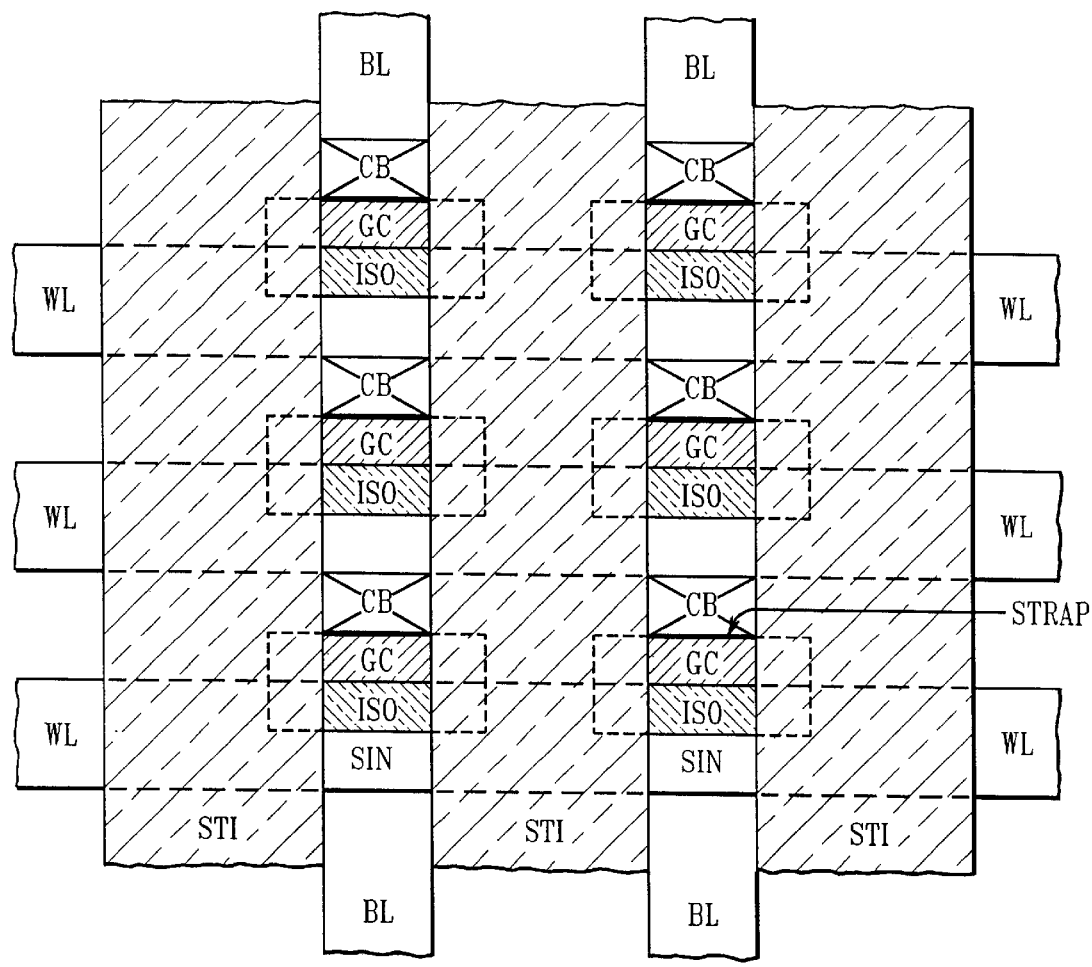
Figure 3:
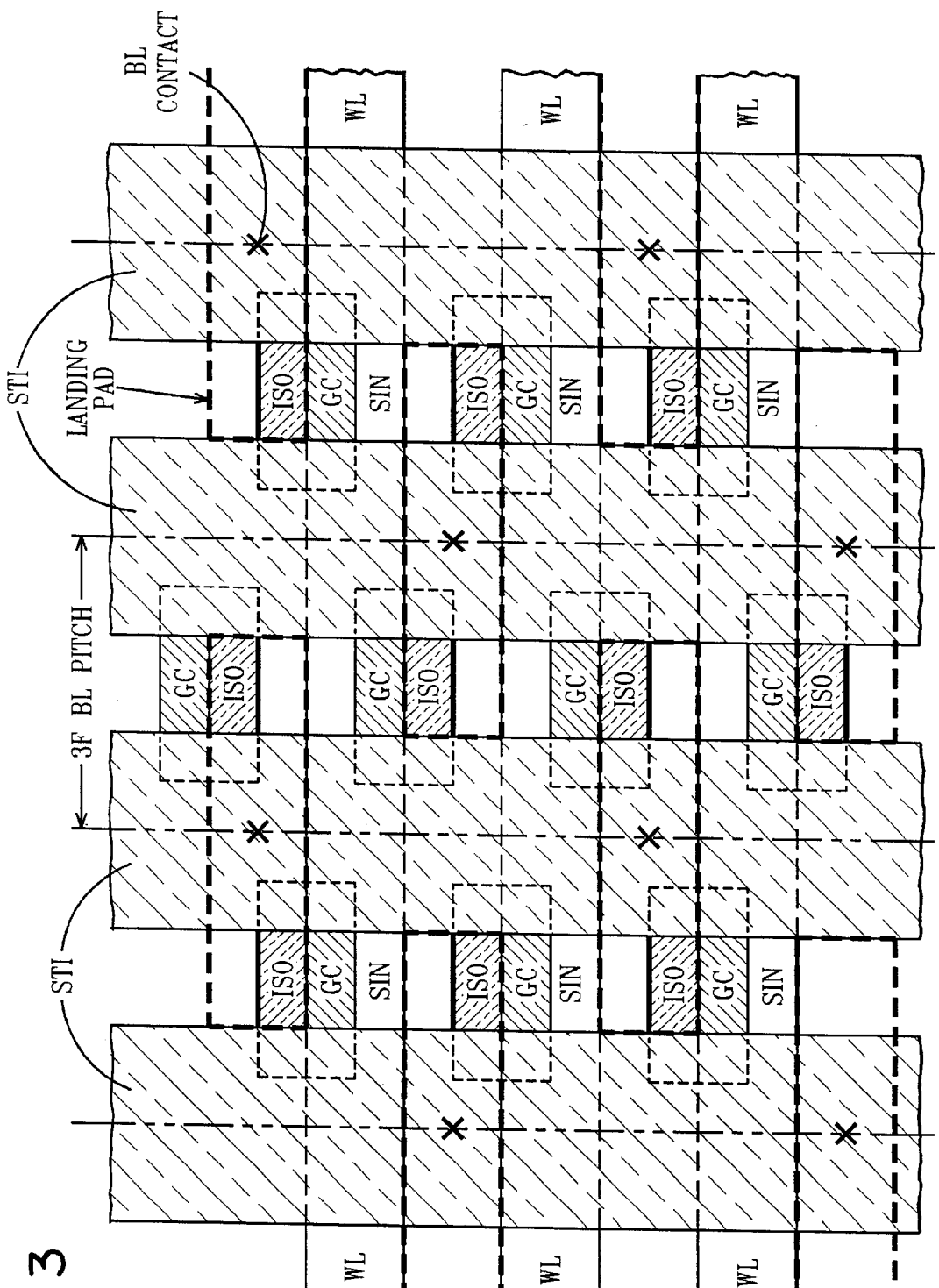
Figure 4:
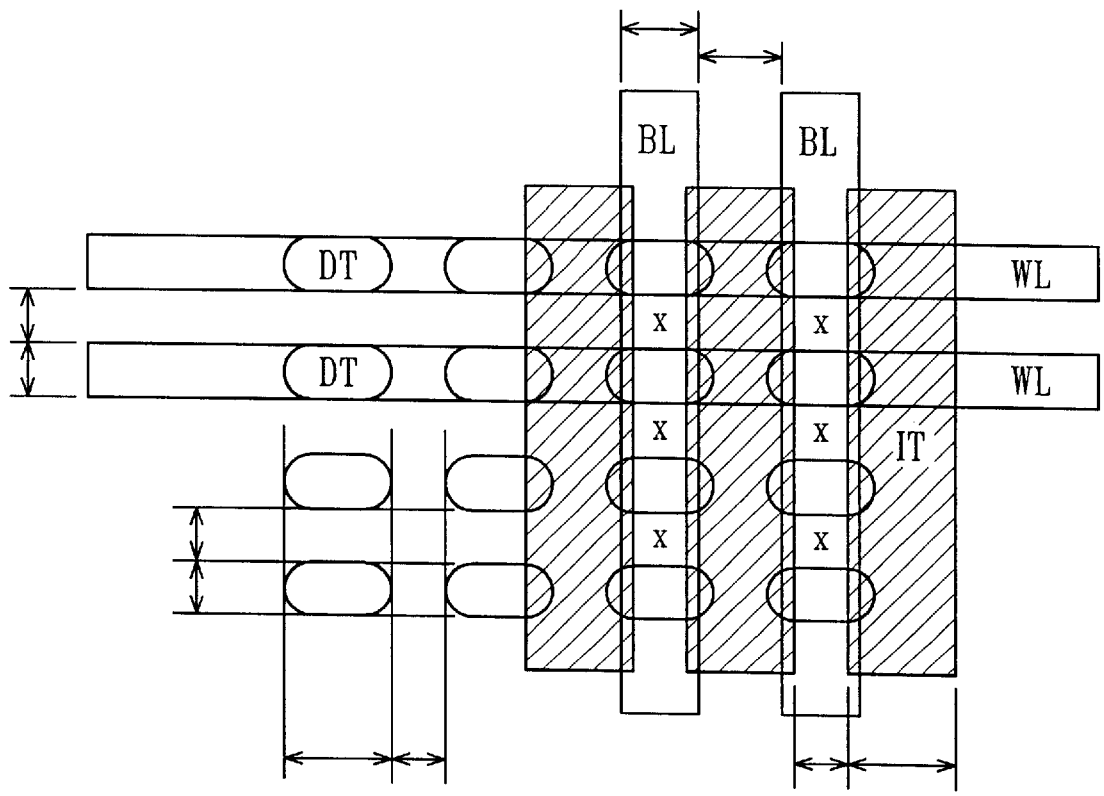
FIG. 4 represents an overhead view of an embodiment of a memory cell layout according to the present invention.

As stated above, memory structures are being developed with increasing compactness. Along these lines, memory cells are being contemplated with densities greater than $8F^2$, where F is the minimum feature size, as referred to above. As a result of the need for ever increasing array densities, the scalability of contemporary planar MOSFET cells for F=150 nm and smaller dimensions faces fundamental concerns. One great concern relating to the scalability of the cell MOSFET is the increased P-well doping concentration needed to meet Off-current objectives.

Increased array well doping concentration may result in a marked increase in array junction leakage. This degrades retention time. The problems of scalability related to the cell MOSFET tends to lead a shift towards vertical MOSFET access transistors in the array, since the channel length of the vertical MOSFET is decoupled from the groundrule.

While a great depth of knowledge of and experience with deep trench (DT) storage capacitor technology may exist, increasingly smaller groundrules and denser cell layouts are challenging the ability to obtain adequate DT storage capacitance, on the order of about 35fF. One difficulty in obtaining adequate storage capacitance is due to several factors. First, limitations exist on the scalability of the thickness of the node dielectric. Second, limitations exist on the etch depth of a deep trench. Third, a reduction of capacitance area can occur with groundrule reduction, or scaling, and denser cell layouts, such as $6F^2$ and $7F^2$ as opposed to $8F^2$.

Problems related to making denser memory structures include a lag effect in reactive ion etching (RIE) caused by smaller storage trench openings. This lag can make etching adequately deep trenches difficult.

Also, as the trenches become deeper, the aspect ratio typically increases. In other words, the cross-sectional area of the trenches does not also increase. Filling extremely high aspect ratio trenches, such as having an aspect ratio of greater than about 50:1, also presents major difficulties. Furthermore, the higher aspect ratios associated with aggressively scaled deep trench capacitors can result in increased series resistance. The increased resistance can result in decreased signal development within a given time window.

The above-described problems may prevent fabrication of a functional $6F^2$ DRAM cell, having a deep trench opening of about 1×1F. Along these lines, the above problems with capacitance and resistance may be insurmountable in the 120 nm generation.

The present invention recognizes a need for DRAM cells containing vertical access transistors, dense layouts, such as denser than $8F^2$, and trench storage capacitors that yield sufficient capacitance and reduced series resistance to avoid degraded signal development. The present invention can be utilized to provide a cell layout containing large size deep trench capacitors, such as on the order of 1×2, for adequate capacitance, reduced resistance and ease of fabrication.

Although some existing DRAM cells employing vertical MOSFET's offer significant scalability advantages over conventional planar designs practiced today, there is still room for improvement. For example, for DRAM cells that utilize vertical MOSFETs and trench storage capacitors, a single bitline contact may be commonly employed to access a pair of bits. The pair of bits may share a common silicon active area (AA). In this type of cell, dynamic coupling between the two back-to-back vertical MOSFET's can result in charge pumping effects and loss of signal.

Modeling has shown that the storage node of the adjacent cell sharing the same AA may collect electrons pumped into the P-well from a collapsing channel inversion layer of the opposing cell. These coupling effects are accentuated as dimensions are scaled down. Along these lines, modeling projections indicate that scalability to 100 nm and below may be problematic because of dynamic charge loss due to coupling between adjacent cells. Among other advantages, the present invention provides a solution to dynamic coupling effect between adjacent vertical MOSFET's, extending scalability to below a 100 nm minimum feature size.

In addition to charge pumping problems described above, known very dense DRAM cell designs can also suffer from threshold voltage variations due to variations in the size of the silicon active area. Such variations can occur with overlay, or alignment, errors between various masking levels and with dimensional variations of features formed by these masking levels. The DRAM cell according to the present invention utilizes a silicon active area region having dimensions independent of all overlay tolerances, thus greatly tightening threshold voltage distribution. A tight threshold voltage distribution can result in a DRAM cell according to the present invention experiencing increased stored charge and better yield.

Furthermore, the present invention provides a new isolation scheme that bounds the active area by shallow trench isolation (STI) regions in the wordline direction and deep trench storage capacitors in the bitline direction.

Still another problem faced with aggressively scaled DRAM cells is the increased aspect, or height-to-width, ratio of the STI regions. The aspect ratio can especially be a concern with vertical MOSFET's in an array because of the typical need for the STI regions to be deep enough to cut the strap to prevent cell-to-cell leakage between straps. Typically, it is required that the STI be at least 500 nm deep to isolate the straps of the vertical MOSFET's. If the thickness of the pad layer is included, an STI aspect ratio of about 7:1 is anticipated by the 100 nm generation. The STI region shapes defined in the array of DRAM cells according to the present invention utilize widths of 2 minimum feature size, or 2F, instead of the customary 1 F size. Furthermore, the array STI design taught here is very "litho friendly", since the present invention employs isolation stripes rather than blocks. As a result, the STI aspect ratio in an array area according to the present invention can be half of that expected by conventional technology.

Yet another problem addressed by the present invention relates to the difficulty in achieving dense DRAM cells, that is, less than $8F^2$, having folded bitline layouts. The present invention permits vertically folded bitline architecture due to its 3F bitline bit pitch.

Another feature of memory cells according to the present invention includes elimination of a separate mask, often referred to as a "cut mask", to cut the strap and gate conductor in the deep trench. Rather, the present invention can utilize a novel wordline scheme that can serve dual roles of providing a wordline conductor and an isolation cut for the strap and gate conductor.

To address the above and other problems, the present invention includes a DRAM cell design that utilizes vertical MOSFET's and large deep trench capacitors. Among the advantages of the present invention are providing a dense cell, on the order of $6F^2$, that is scalable to below F=100 nm. Also, the present invention eliminates dynamic leakage due to adjacent cell activity. This can be accomplished by using a single bit per bitline contact.

The present invention also permits very tight Vt distribution due to the size of the active area (AA), which is independent of overlay variations. Additionally, the present invention includes a novel isolation structure and process provided by adjacency of STI and deep storage trenches. Furthermore, the present invention provides a large DT (1×2) size for large storage capacitance, reduced resistance and ease of fabrication.

Also, as referred to above, the present invention provides a 3F bitline pitch that allows vertically folded architecture. According to the present invention, a GC/strap DT cut mask may also be eliminated due to the dual role, conductor and isolation, of wordlines. The present invention also provides independent array and support gate oxidations.

In general, a memory cell according to the present invention includes a planar semiconductor substrate and a deep trench in the semiconductor substrate. The deep trench has a plurality of side walls and a bottom and may have the dimensions described above.

A storage capacitor is arranged at the bottom of the deep trench. A vertical transistor extends down at least one side wall of the deep trench above the storage capacitor. The transistor has a source diffusion extending in the plane of the substrate adjacent the deep trench. An isolation extends down at least one other sidewall of the deep trench opposite the vertical transistor. A gate conductor extends within the deep trench.

Shallow trench isolation regions extend along a surface of the substrate in a direction transverse to the sidewall where the vertical transistor extends. A wordline extends over the deep trench and connected to the gate conductor. A bitline extends above the surface plane of the substrate having a contact to the source diffusion between the shallow trench isolation regions.

FIG. 1 illustrates one embodiment of a memory array according to the present invention. The active area (AA) in the embodiment shown in FIG. 1 is patterned as a stripe on the semiconductor surface. The array illustrated in FIG. 1 includes wordlines 1 spaced at a 2F pitch and bitlines 3 spaced at a 3F pitch. The structure shown in FIG. 1 also includes trenches 5 having 2F by 1F dimensions. The trenches are capped by an oxide region. Wordlines 1 pass over the trenches, while bitline contact (CB) is made in the AA space between the trenches. According to the present invention, the groundrule "F" or minimum feature dimension typically has a longer length in the wordline pitch direction than in the bitline pitch direction. According to one example, F is about 135 nm in the bitline pitch direction and about 165 nm in the wordline pitch direction.

As can be seen in FIG. 1, a memory cell structure according to the present invention may also include shallow trench isolation (STI) regions 7. Buried strap interconnection 9 is provided at a single side of the deep trenches. The other sides are isolated. One side 11 of the trenches is isolated by a collar oxide. The other two sides are isolated by shallow trench isolation (sti) 7. Pad nitride regions 13 lie adjacent sides of the deep trenches.

Figure 5:
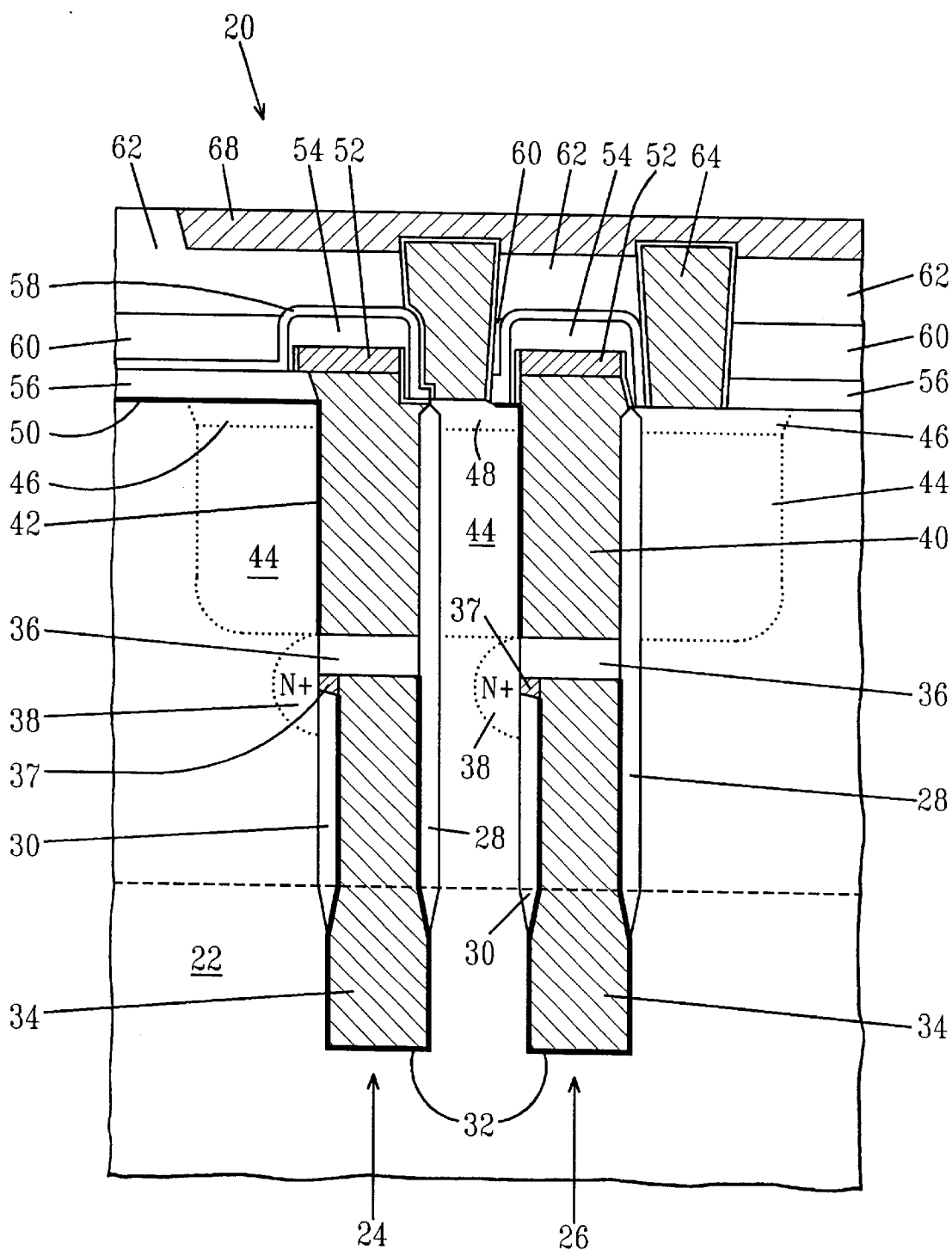
FIG. 5 represents a cross-sectional view of another embodiment of a memory cell structure according to the present invention.

FIG. 5 illustrates a cross-sectional view of an embodiment of a memory cell structure that may be included in the array illustrated in FIG. 1. The memory cell structure illustrated in FIG. 5 is formed in a semiconductor substrate 20. A buried N plate 22 is arranged in the substrate 20. Deep trenches 24 and 26 are formed in the substrate into the buried N plate.

Collar oxide 28 is formed on a sidewall of each deep trench. The collar oxide may extend about the entire deep trench in certain regions of the deep trench as indicated by collar oxide portions 30. Node dielectric 32 is provided on portions of the deep trench walls and collar oxide regions 30 the bottom portion of the trench is filled with N+ doped polysilicon 34.

On top of this region of polysilicon lies trench top oxide region 36. Buried strap 37 is arranged as shown in FIG. 5 between the collar oxide region 30 and the trench top oxide 36. A buried strap outdiffusion 38 lies adjacent to the trench top oxide region and part of the collar region 30.

Portions of the deep trench above the trench top oxide region are also filled with N+ doped polysilicon 40, which serves as a gate conductor. Gate oxide 42 is provided between the N+ doped polysilicon 40 region and the wall of the deep trench.

P-type channel doping profile (VA/P) regions 44 for the channel of the vertical MOSFET lie adjacent the portion of the deep trench down to the level of the bottom of the N+ doped polysilicon regions 40. N+(XA/N+) regions 46, which define the bitline contact diffusion, lie above VA/P regions 44 adjacent the deep trench regions illustrated in FIG. 5, while XA region 48 lies above the VA/P region between the two deep trenches 24 and 26 in the embodiment illustrated in FIG. 5.

The structure illustrated in FIG. 5 includes high density plasma (HDP) oxide region 50. HDP process typically is utilized because it provides superior filling of high-aspect ratio regions than conventional CVD oxide. Tungsten and silicon regions 52 overlie the top of the deep trenches. On top of and adjacent to sides of the tungsten and polysilicon regions 52 lie $Si_3N_4$ regions 54. A nitride liner 56 overlies HDP oxide region 50. Nitride liner 56 merges into nitride spacer/sidewall oxide region 58 adjacent to sides of the tungsten and polysilicon and $Si_3N_4$ regions 54 as well as overlying the $Si_3N_4$ regions 54.

Borophosphosilicate glass (BPSG) regions 60 overlie the nitride liner. Overlying the BPSG and nitride spacer/sidewall oxide region 58 is a layer of tetraethyl ortho silicate (TEOS) 62.

Contact-to-bitline (CB) polysilicon regions 64, which provide a conductive stud between bitline contact diffusion XA and bitline metal MO 68, extend out through the TEOS and BPSG layers to the level of XA regions 48 and 46. CB TEOS liner regions 66 surround the CB polysilicon region 64. The bit line metal/metal level 0 (M0) 68 overlies portions of the TEOS layer 62 as well as the CB polysilicon and CB TEOS liner regions 64 and 66.

Figure 6A:
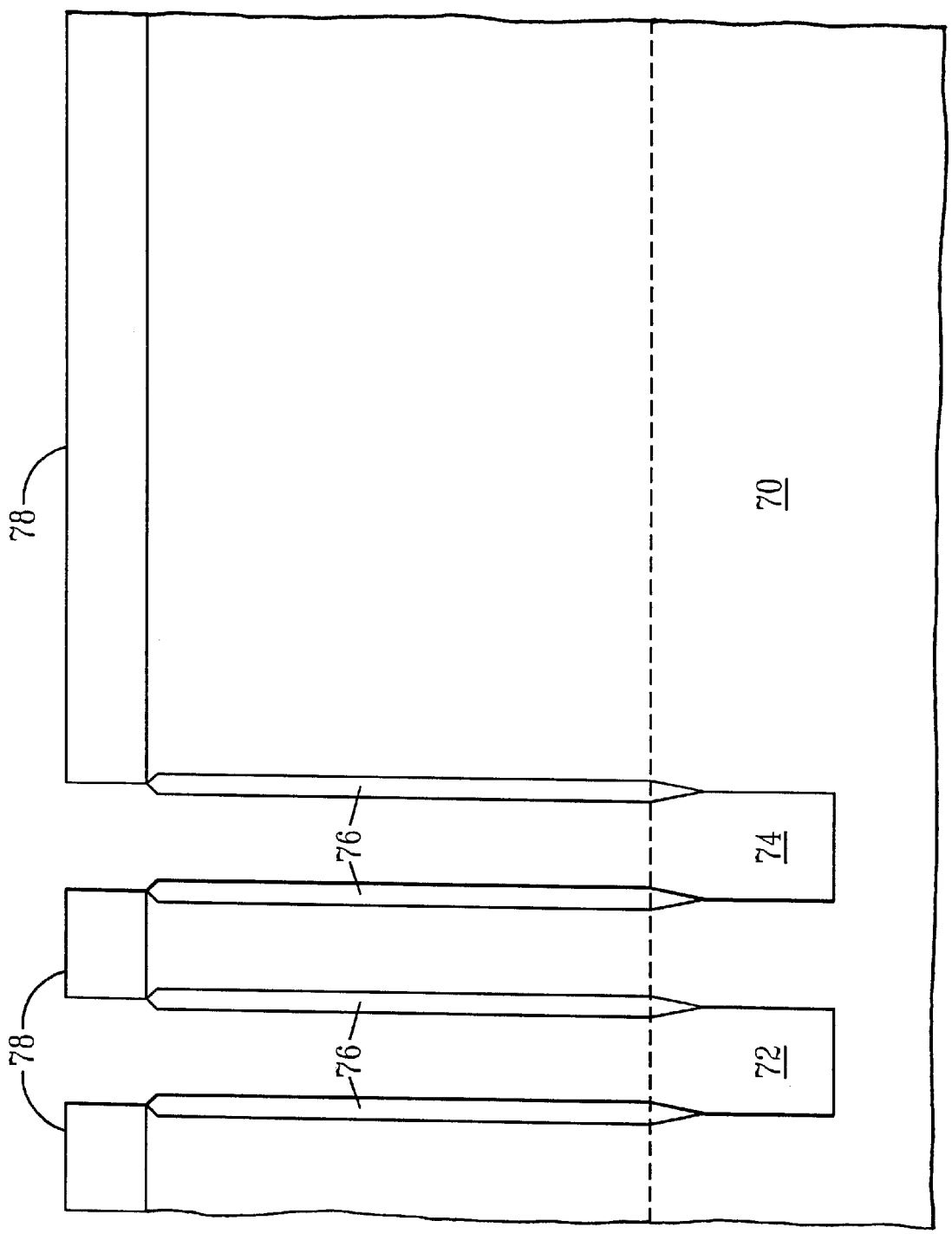

FIGS. 6a–6f, 7a–7f, 8a–8f, 9a–9f and 10a–10d illustrate various stages of an embodiment of a process for forming an embodiment of a memory cell structure according to the present invention. Along these lines, FIG. 6a illustrates a portion of a semiconductor substrate in which a buried N plate 70 has been formed. Deep trenches 72 and 74 have been formed through the substrate into the buried N plate region 70. Collar regions 76 have been provided on sidewalls of the deep trenches. The collar regions may be formed by local oxidation of silicon (LOCOS) or by deposition and anisotropic etching. Nitride pad regions 78 have been formed over the semiconductor substrate with the exception of over deep trenches 72 and 74.

Figure 6B:
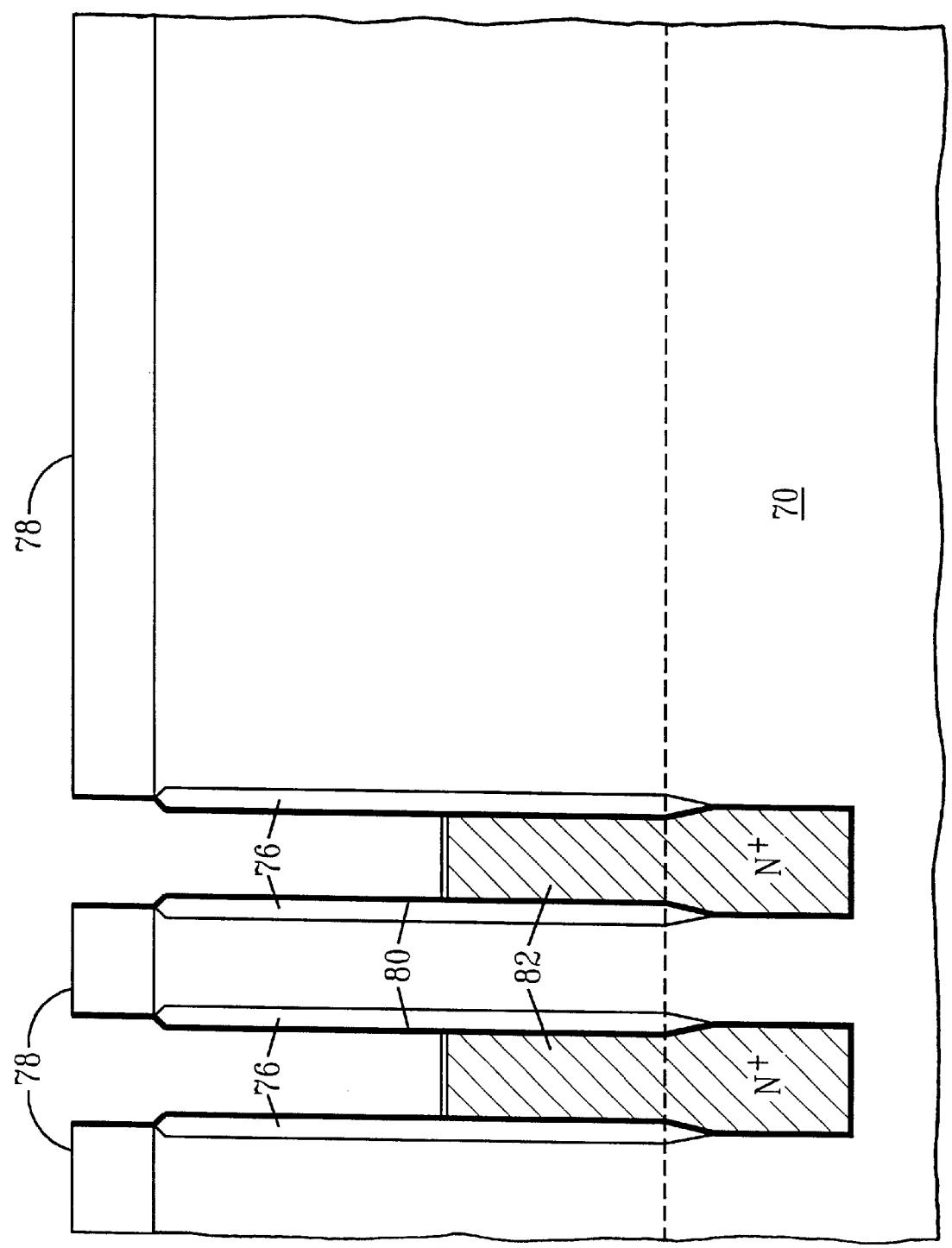

Next, as illustrated in FIG. 6b, node dielectric layer 80 may be deposited on the collar region 76 and surfaces of the deep trenches 72 and 74 not covered by collar regions 76. Typically, the node dielectric is a nitride. After deposition of the node dielectric, the node dielectric may be reoxidized. Then, after deposition of the node dielectric 80, the deep trench may be filled with N+ doped polysilicon.

The entire structure may then be planarized and the polysilicon etched down to the level illustrated in FIG. 6b. The top of the polycrystalline silicon may then be oxidized. Typically, about the top three nanometers of the polysilicon film may be oxidized to form oxide region 82.

Figure 6C:
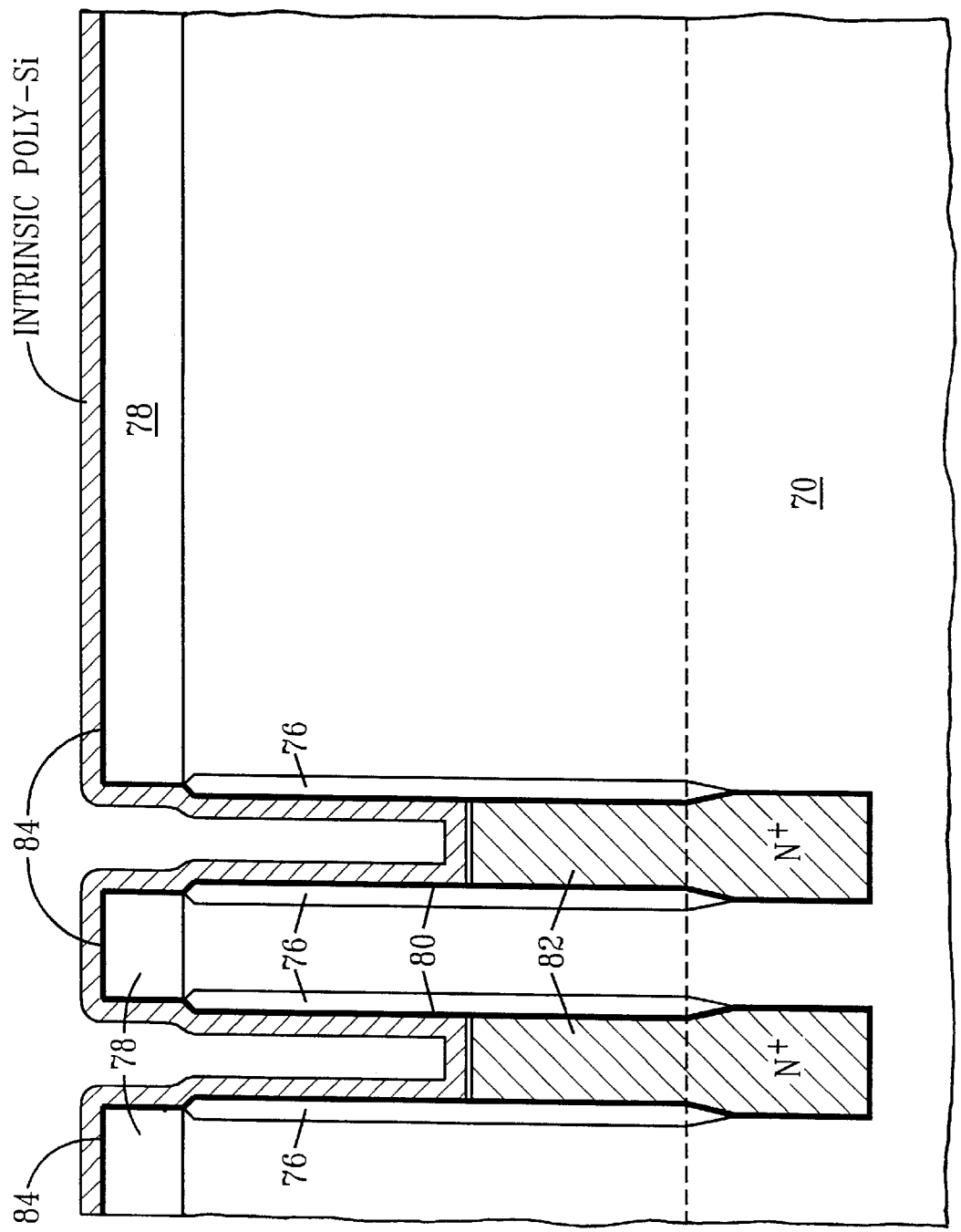

As illustrated in FIG. 6c, a nitride liner 84 may then be deposited over surfaces on the semiconductor substrate as well as within the deep trench. According to one embodiment, the node liner is about 4 nanometers thick, but may be formed with any suitable thickness. On top of the nitride liner is deposited an intrinsic polysilicon layer. The intrinsic polysilicon layer may have a thickness of about 15 to about 20 nanometers.

Aspects of single sided buried strap and forming the strap along one sidewall of the deep trench, particularly while at least one other sidewall of the trench is isolated is described in greater detail in U.S. patent application Ser. No. 09/603, 442 corresponding to IBM docket number FIS-99-0290, the entire contents of the disclosure of which is hereby incorporated by reference.

Figure 6D:
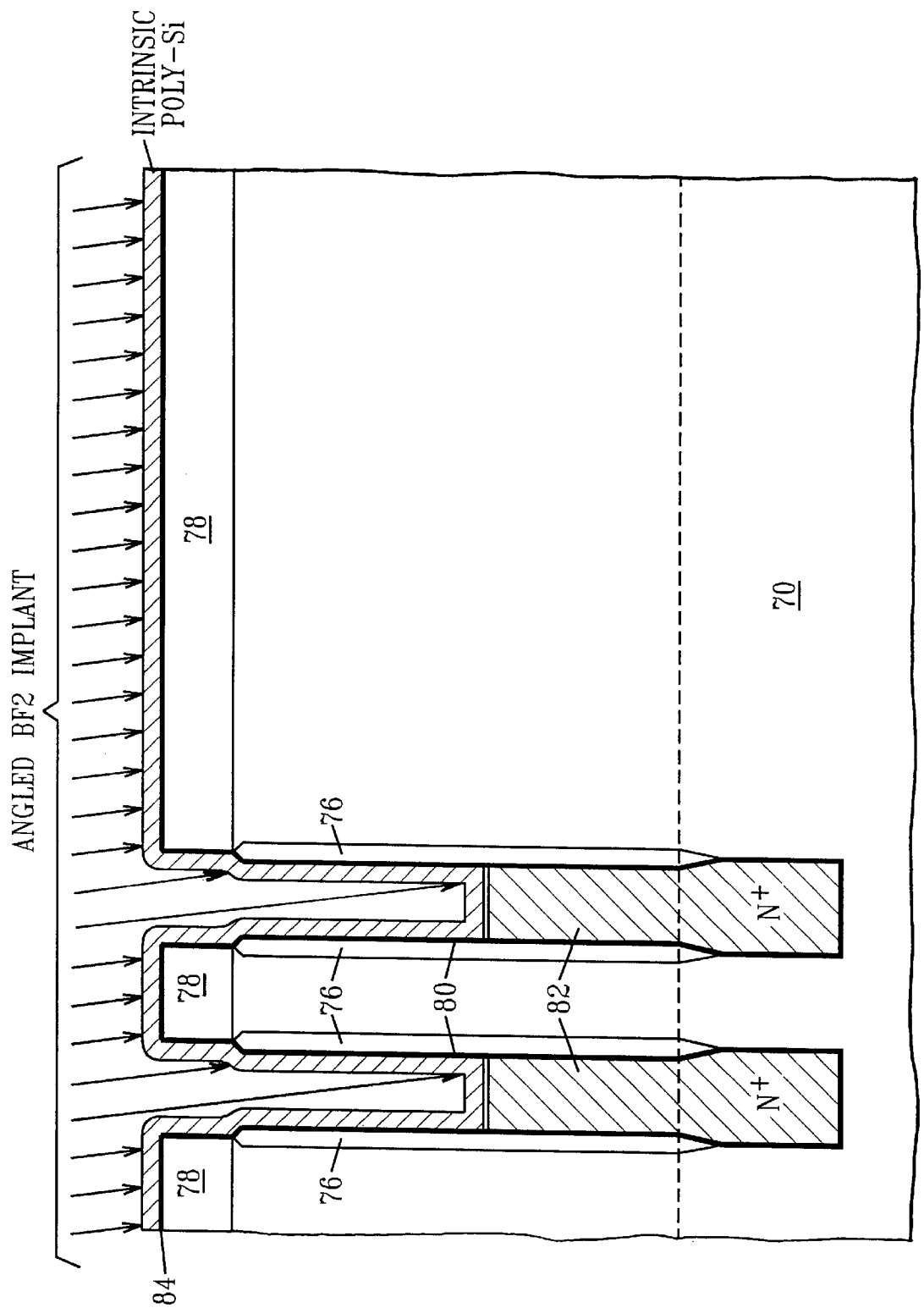

After deposition of the intrinsic polysilicon layer, an ion implant may be carried out as illustrated in FIG. 6d. The ion implant may be angled with respect to the semiconductor substrate. The ions utilized may be $BF_2$. About $1 \times 10^{14}$ $BF_2$ ions may be utilized at about 20 KeV. Other ion species may alternatively or additionally be implanted utilizing other process parameters.

Figure 6E:
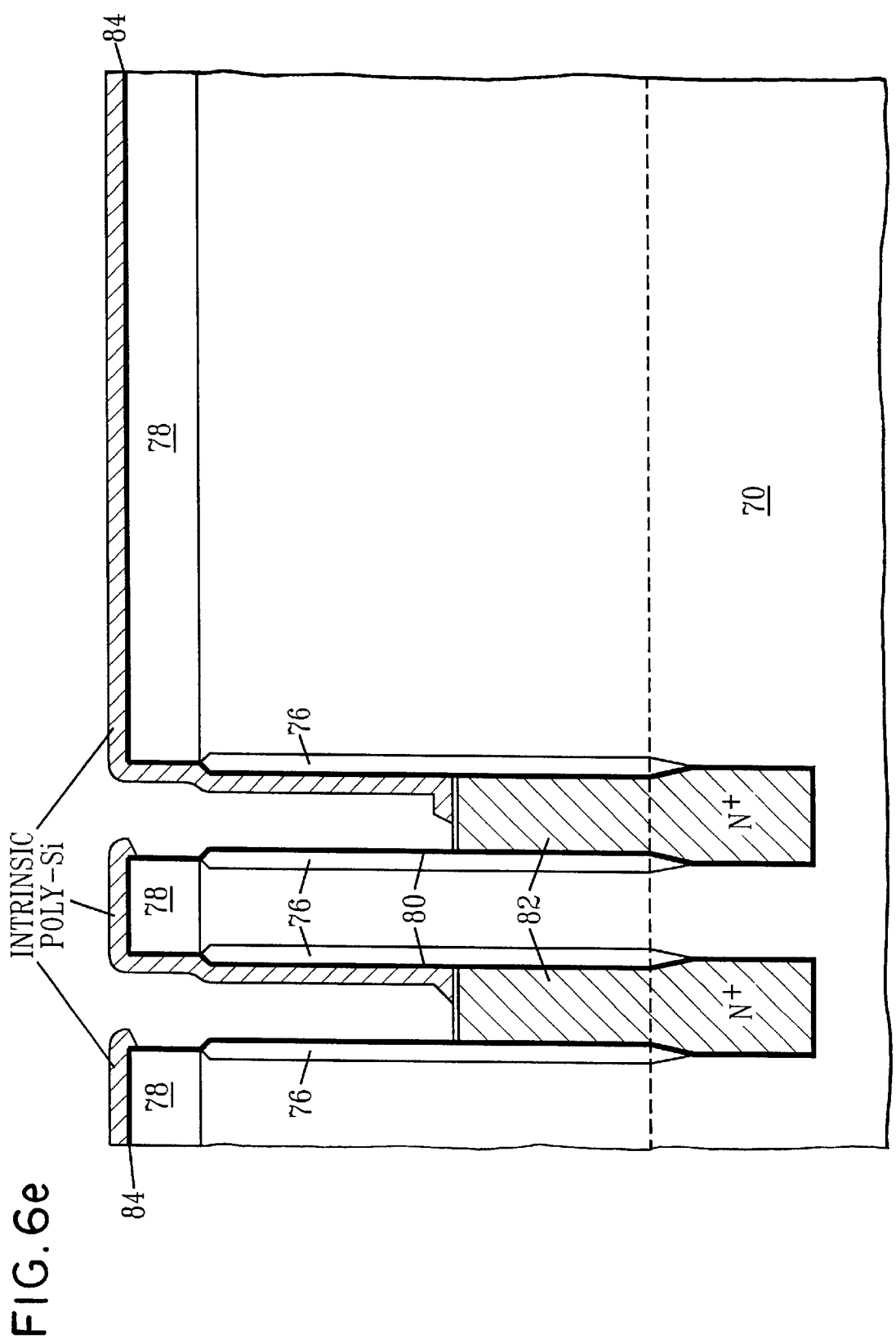

Next, the intrinsic portion of the polysilicon layer may be etched, leaving the doped polysilicon regions. The etch may be carried out utilizing $NH_4OH$. The resulting structure is illustrated in FIG. 6e.

Figure 6F:
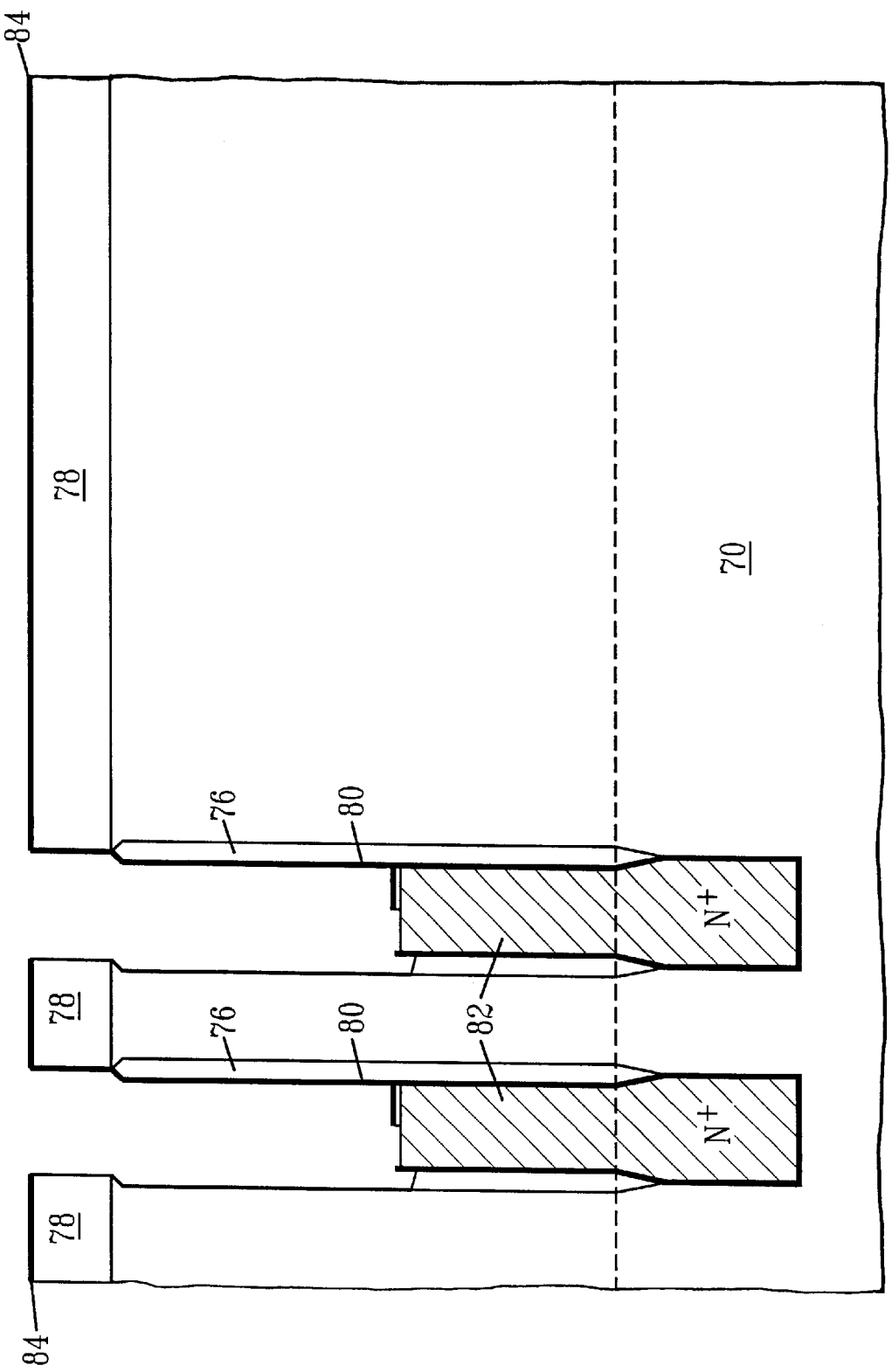

After etch of the intrinsic polysilicon, the exposed portion of the nitride liner and node dielectric may be etched. The etch may be carried out utilizing HF and glycerol. Then, the remaining polysilicon layer may be etched utilizing $NH_4OH$. Subsequently, the portion of the collar that is exposed may be etched. This etch forms a divot in the collar between the N+ doped polysilicon in the trench and the silicon sidewall. The collar etch may be carried out utilizing BHF. FIG. 6f illustrates the resulting structure.

Figure 7A:
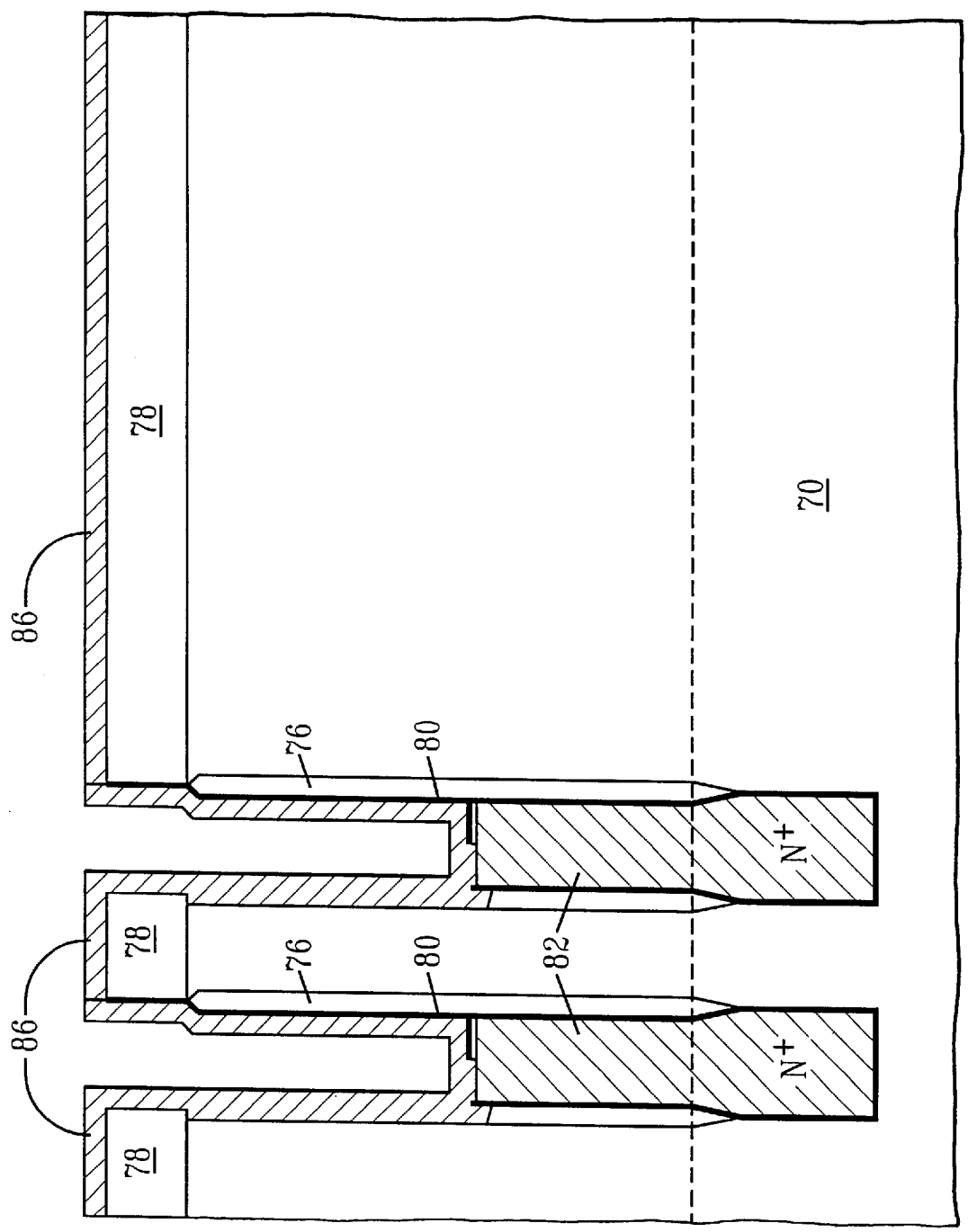
Figure 7B:
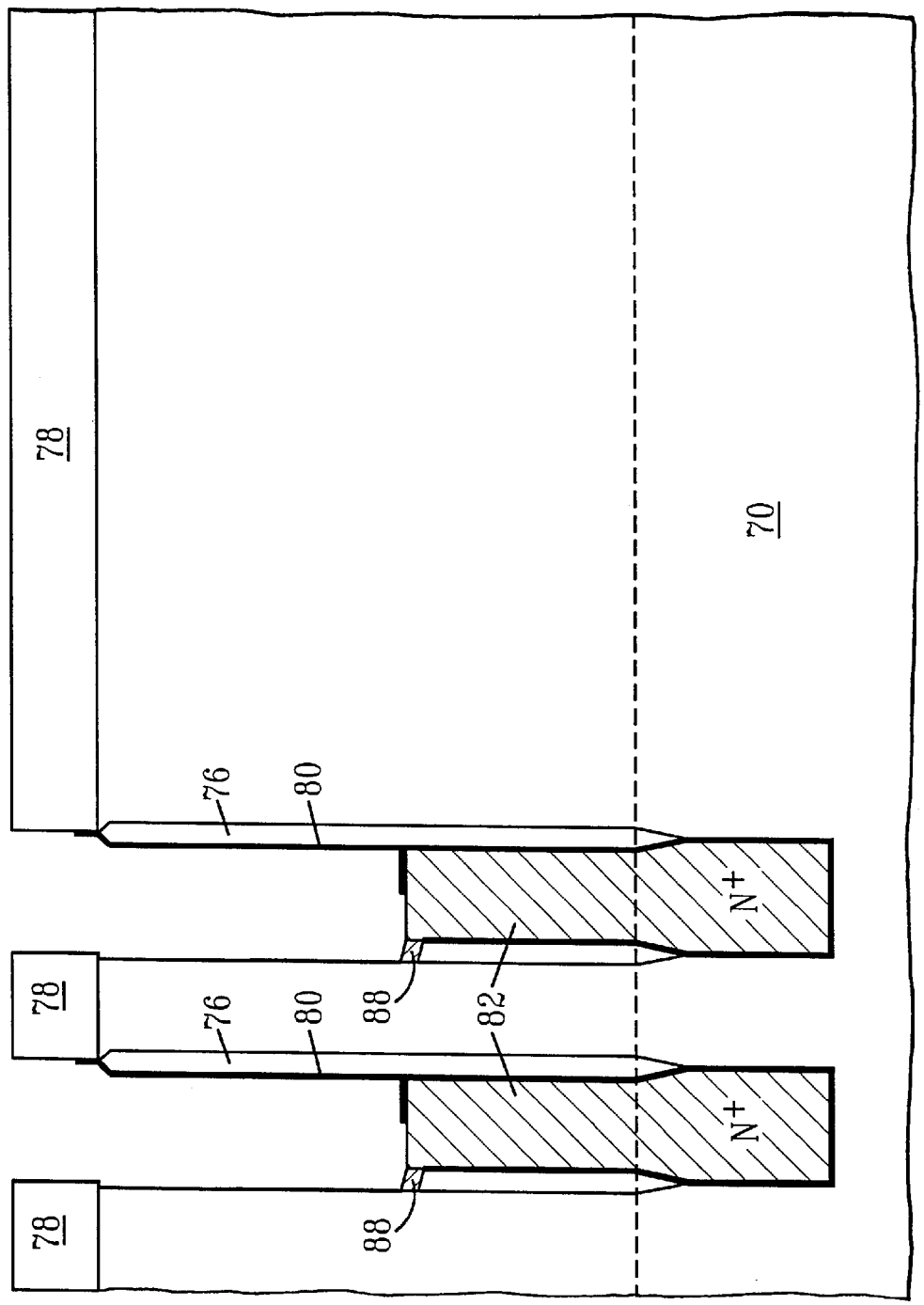

As illustrated in FIG. 7a, a layer of strap polysilicon 86 may be then be deposited on all exposed surfaces of the structure. The deposited polysilicon fills the above-mentioned divot. Isotropic etching of the polysilicon and interfacial nitride may then be carried out, leaving a small region of polysilicon in the divot. The polysilicon etch may be carried out utilizing a wet etch. FIG. 7b illustrates the structure resulting after the polysilicon etch and interfacial nitride etch. As illustrated in FIG. 7b, after etching of the polysilicon and nitride, buried strap 88 remains at the top of the collar region about midway down the trench.

Figure 7C:
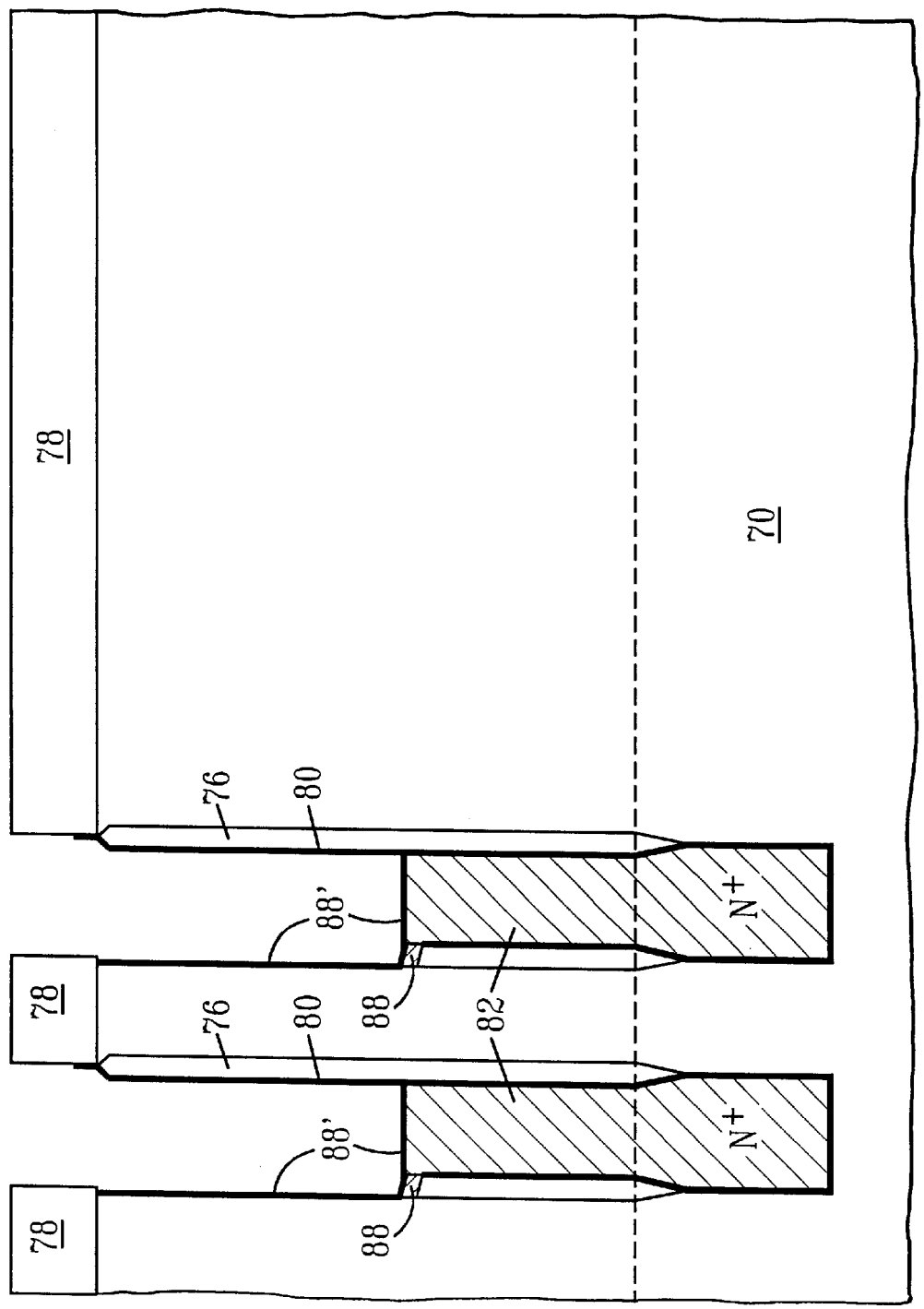

An array sacrificial oxide layer 88 may then be formed on silicon surfaces of the structure as illustrated in FIG. 7c.

After formation of the sacrificial oxidation regions 88, the pad nitride and nitride layer regions may be stripped. At this time, N+ bitline contact diffusion (XA) implant regions 90 may be formed. FIG. 7d shows the resulting structure.

Figure 7E:
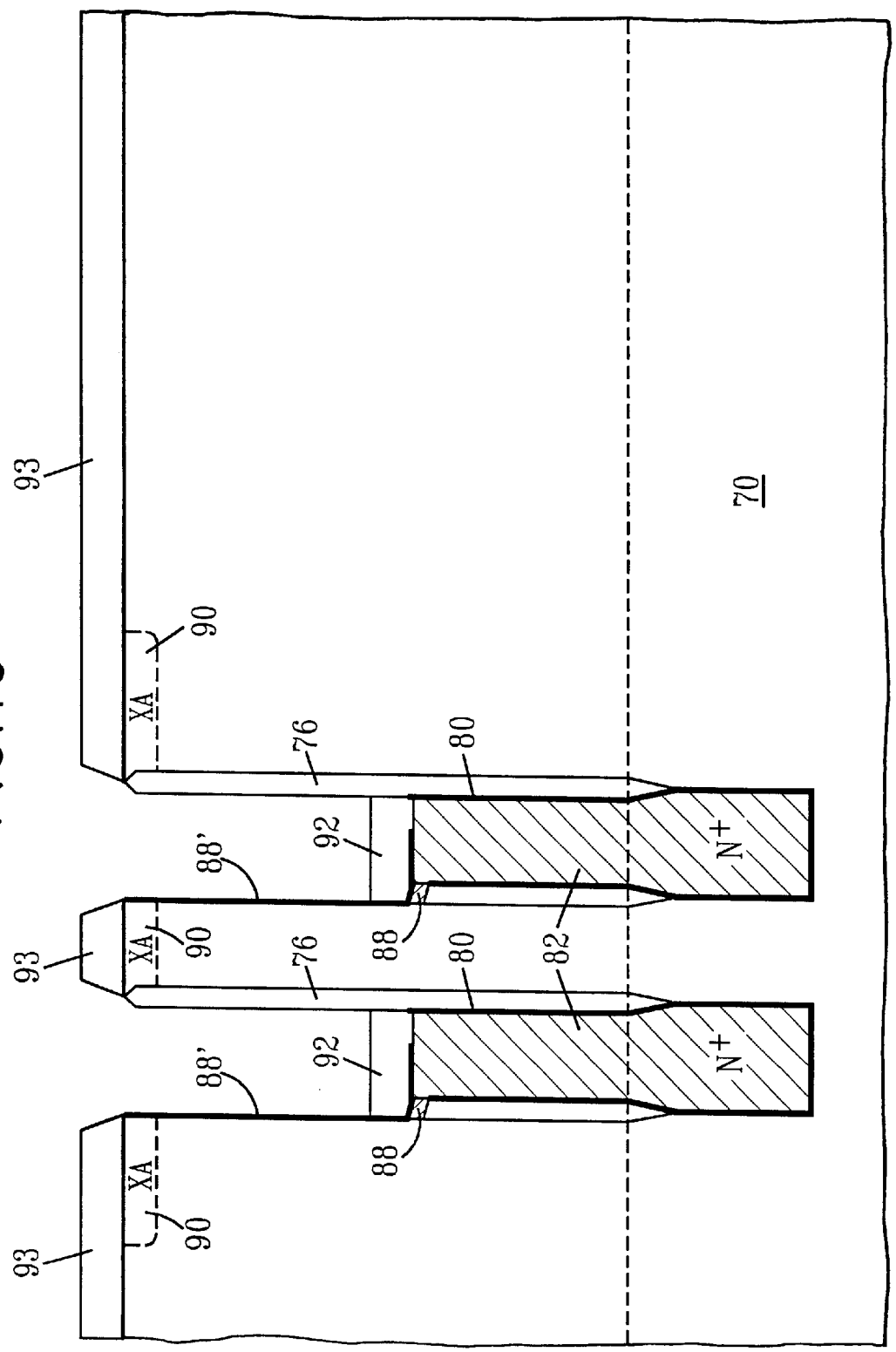

After formation of XA implant regions 90, trench top oxide regions 92 and high density plasma (HDP) oxide regions 93 may be formed. HDP oxide may also be deposited on the sacrificial oxide layer 88. FIG. 7e illustrates the resulting structure.

Figure 7F:
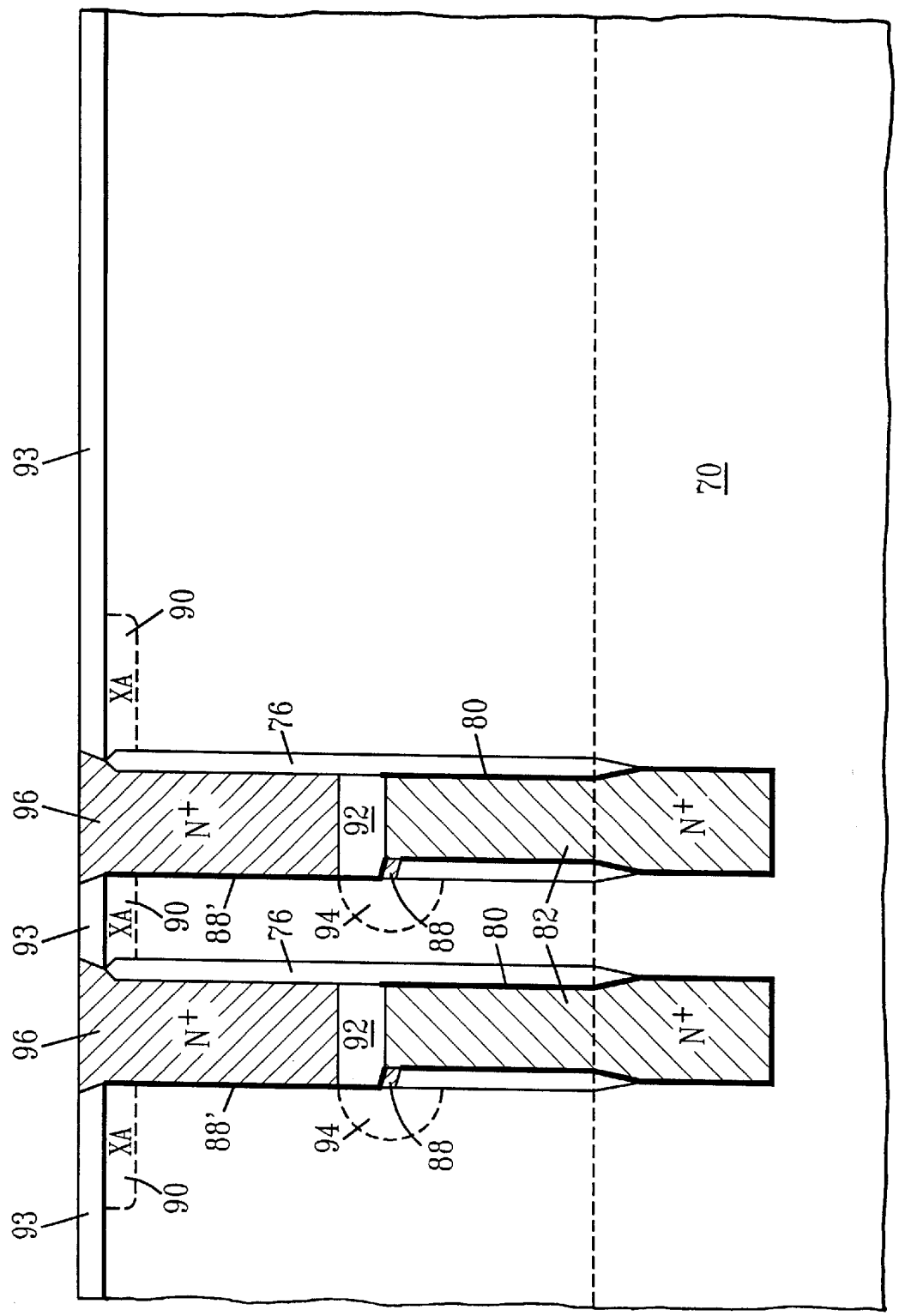

Next, the trench sidewall oxide may be stripped, leaving a substantial portion of HDP oxide on the horizontal surface, and trench gate oxidation carried out. The trench gate oxidation may be carried out with a rapid thermal oxidation process. At this point, outdiffusion of the buried strap may be carried out to form the buried strap outdiffusion region 94. Also, the array N+ doped polysilicon may be deposited and planarized to form polysilicon regions 96. FIG. 7f illustrates the resulting structure.

Figure 8B:
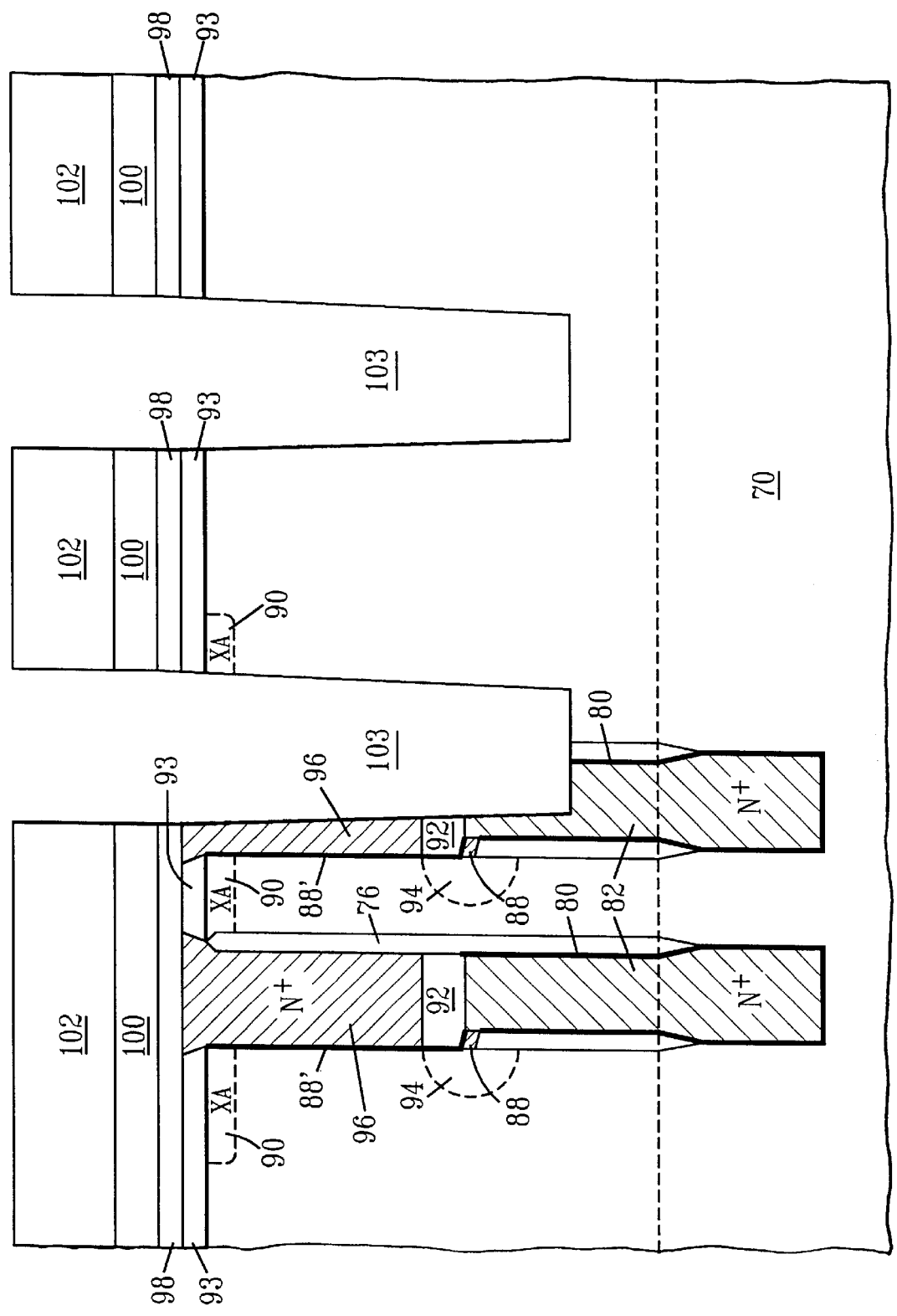

At this stage, pad nitride layer 98 may be deposited to result in the structure illustrated in FIG. 8a. After forming pad nitride layer 98, a layer of active area TEOS 100 may be deposited over the pad nitride layer and the layer of active area photoresist 102 may be deposited. The resist may be patterned and the active area etched through the active area TEOS layer 100 and into the substrate. FIG. 8b shows the resulting structure.

Figure 8C:
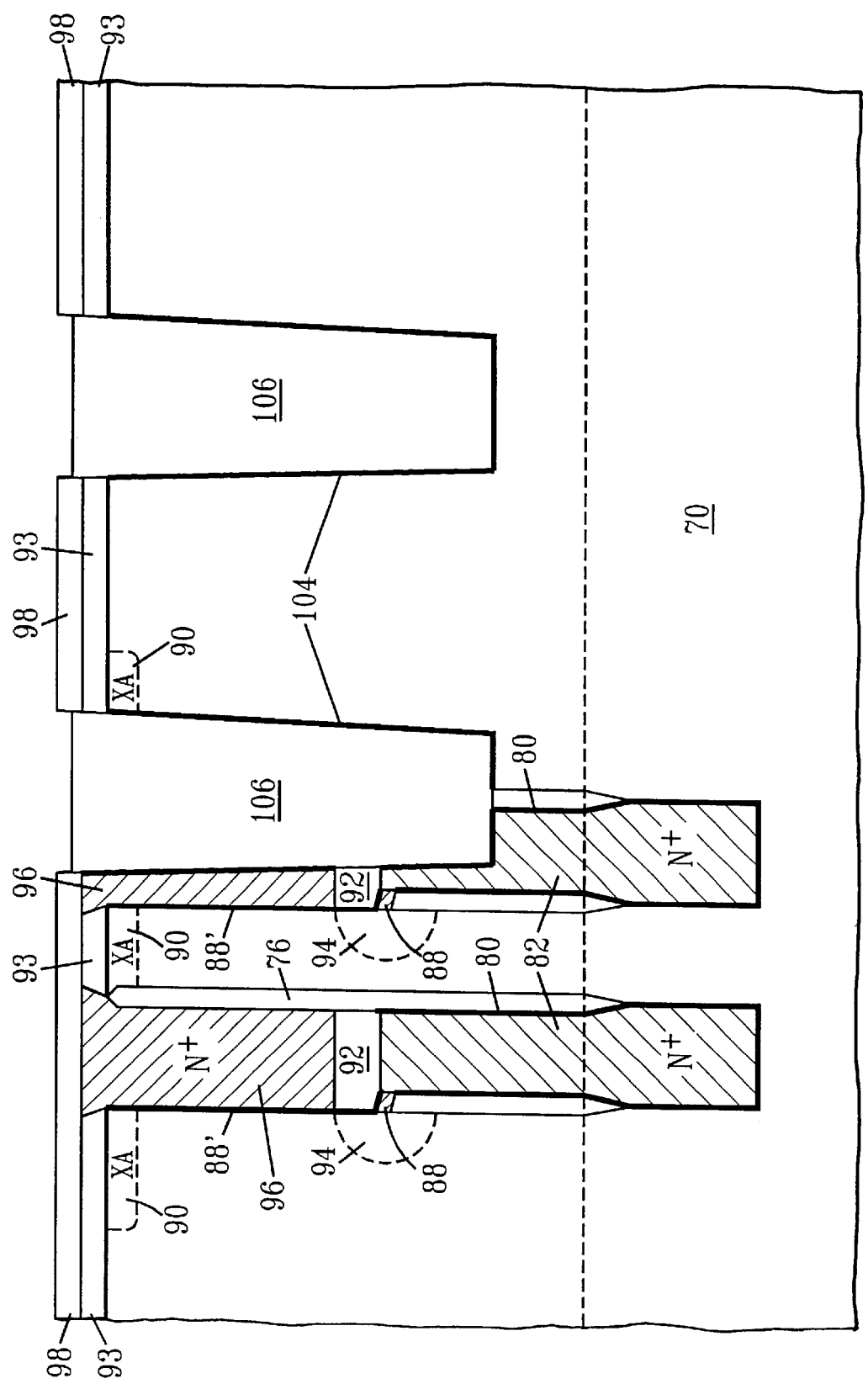

After etching of the active area, active area oxidation may be carried out to form active area oxide 104 on surfaces of the active area region 103 etched in the substrate. HDP oxide layer 106 may be deposited in the active area regions 103 etched in the substrate. Subsequently, the oxide may be planarized and the active area resist etched. FIG. 8c illustrates the resulting structure.

Figure 8D:
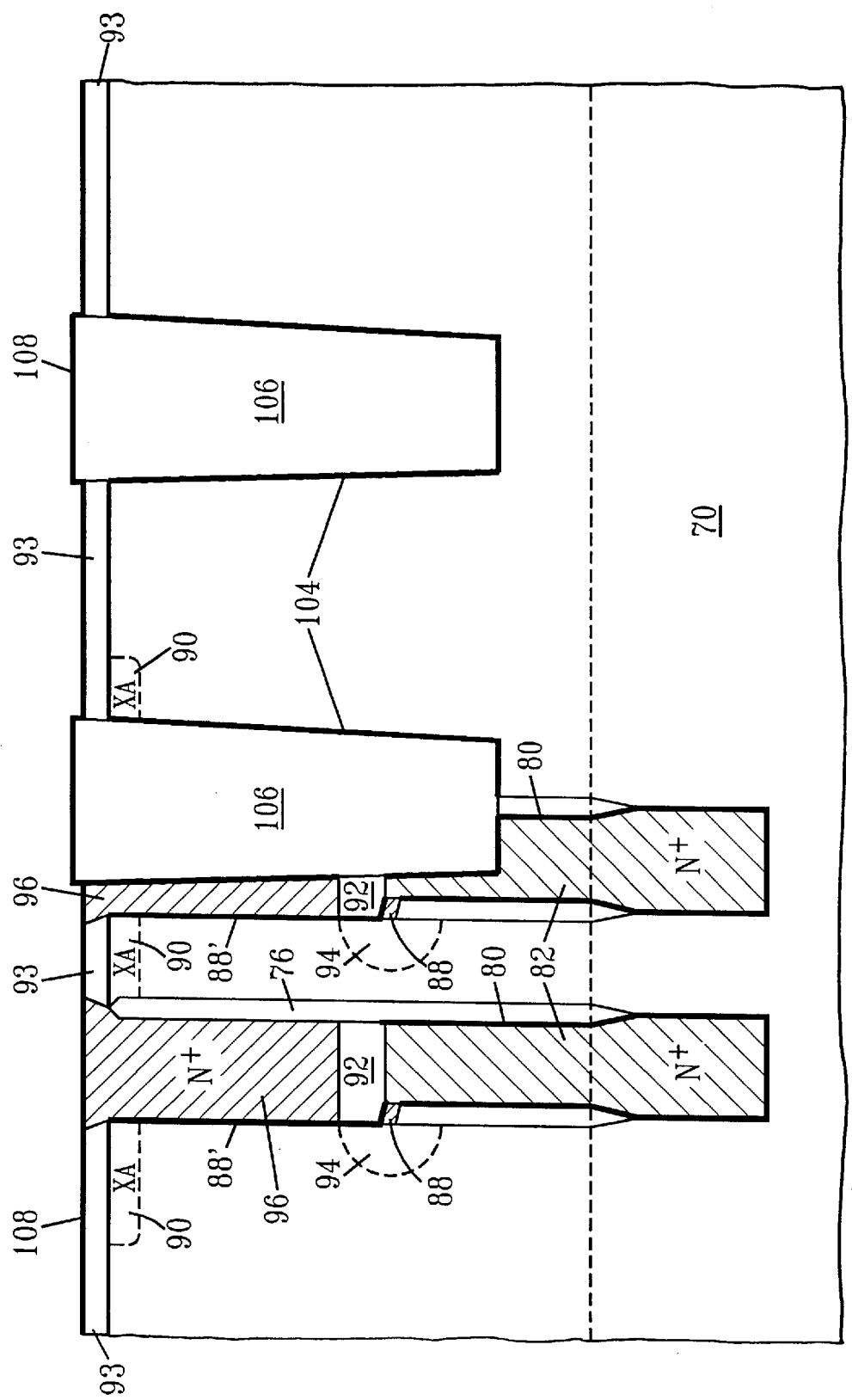
Figure 8F:
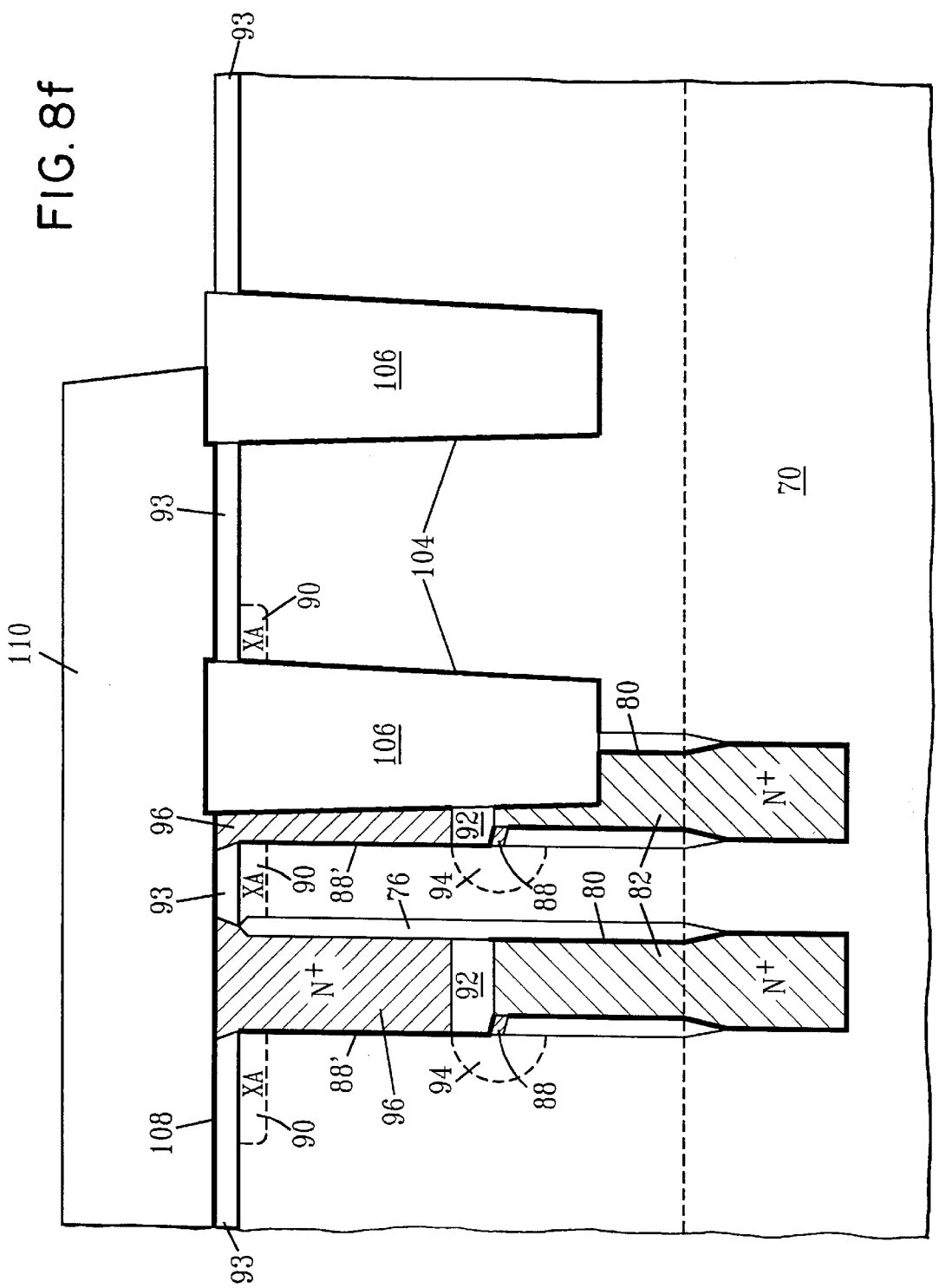

After removing the active area resist, the nitride region 98 is stripped from the structure and nitride etch stop layer 108 deposited. FIG. 8d illustrates the structure to this step. An etch support mask 110 may then be deposited to result in the structure illustrated in FIG. 8e. Typically, the nitride etch stop layer has a thickness of about 5 nanometers, but any suitable thickness may be utilized. After depositing the etch support mask photoresist layer 110 and patterning of this layer, regions of the nitride etch stop exposed by patterning of the etch support mask may be etched to result in the structure illustrated in FIG. 8f.

Figure 9A:
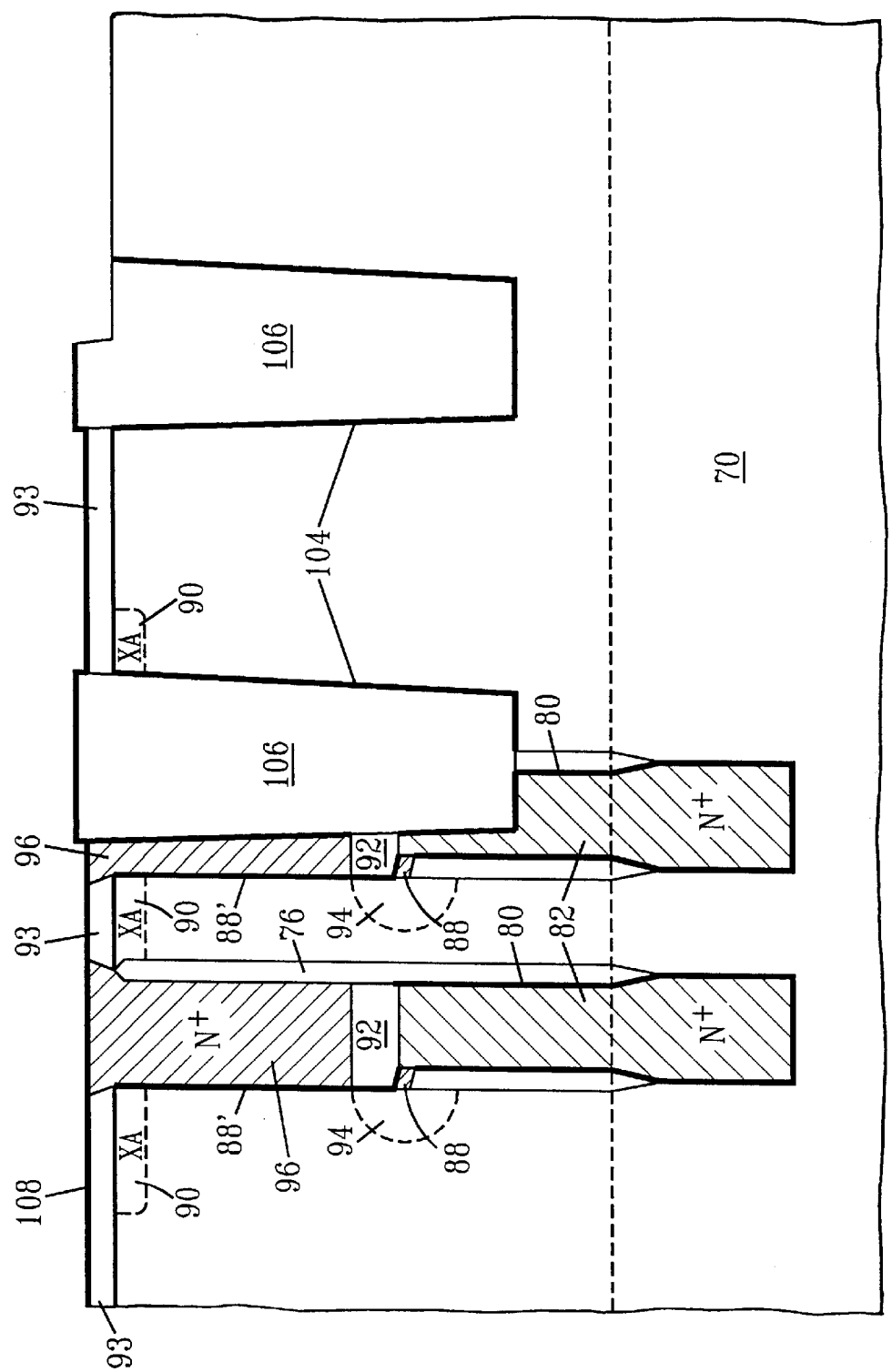

Next, the etch support mask is stripped along with the HDP oxide exposed by etching of portions of the nitride etch stop. Support gate sacrificial oxidation layer (not shown) may be formed at this time. At this time, Wx and Zx implants in supports may be carried out to form various P-wells and N-wells in supports. Support gate oxidation is also formed (not shown). FIG. 9a illustrates the resulting structure.

Figure 9B:
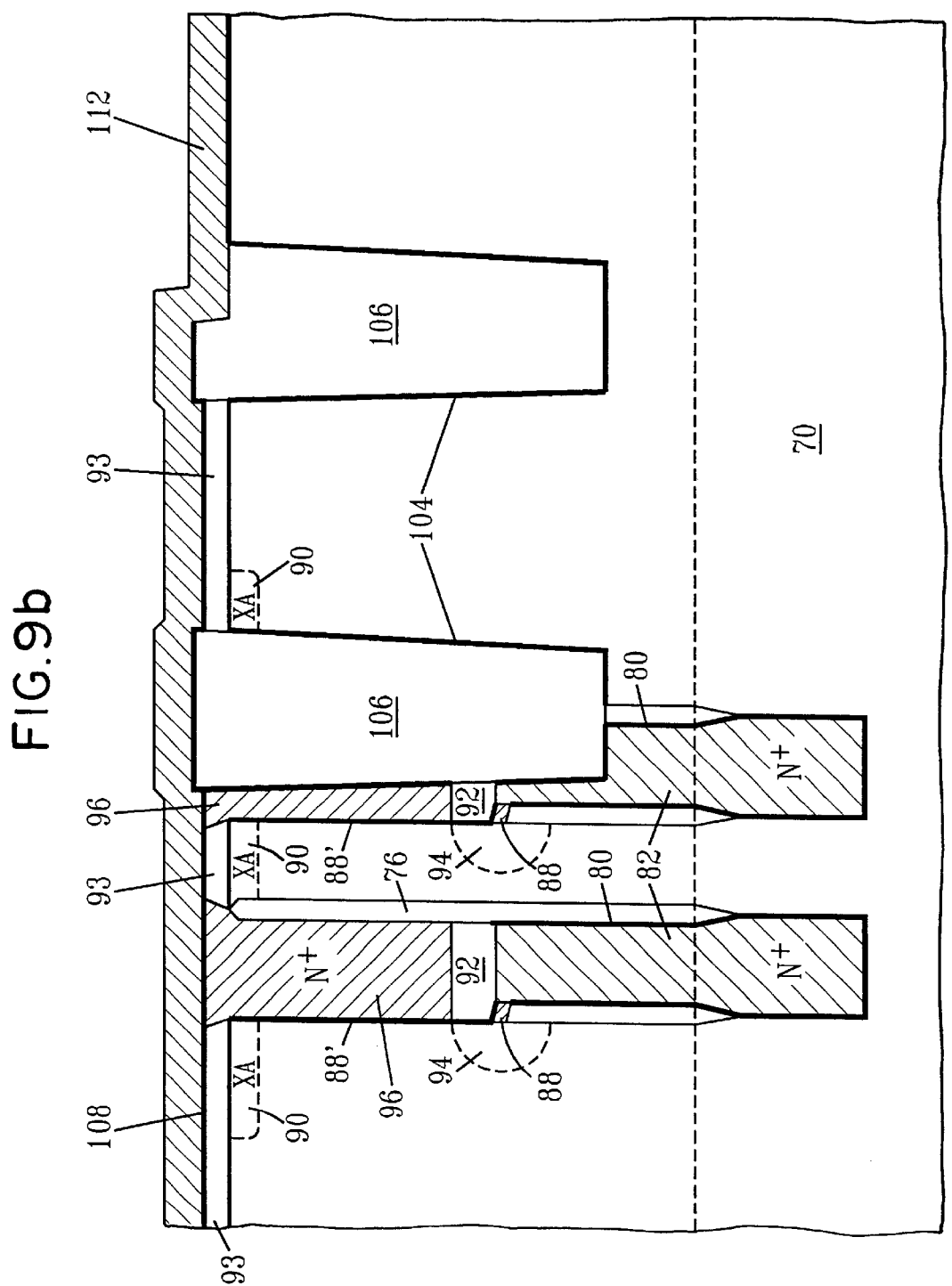
Figure 9C:
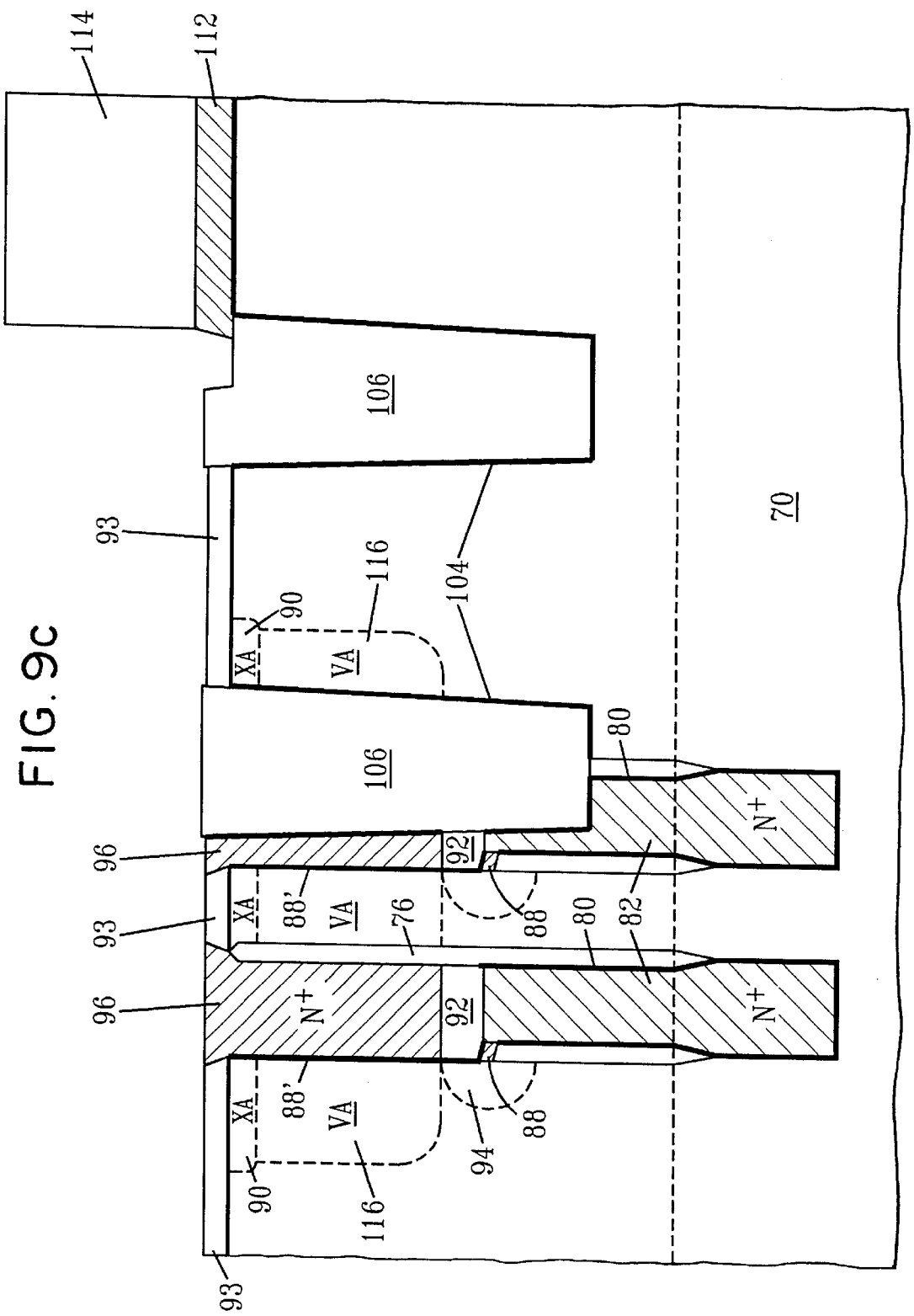

Gate polycrystalline silicon layer 112 may be formed over the entire structure as illustrated in FIG. 9b. An etch array resist mask may then be formed to mask certain portions of the structure. FIG. 9c illustrates the etch array mask 114. After forming the etch array mask, the polysilicon layer 112 may be etched as well as remaining portions of the nitride etch stop 108. After etching, VA implant regions 116 may be formed in the substrate adjacent to deep trenches. The VA implants define the channel doping profile for the vertical MOSFETs. Then, the etch array mask resist 114 may be stripped.

Figure 9D:
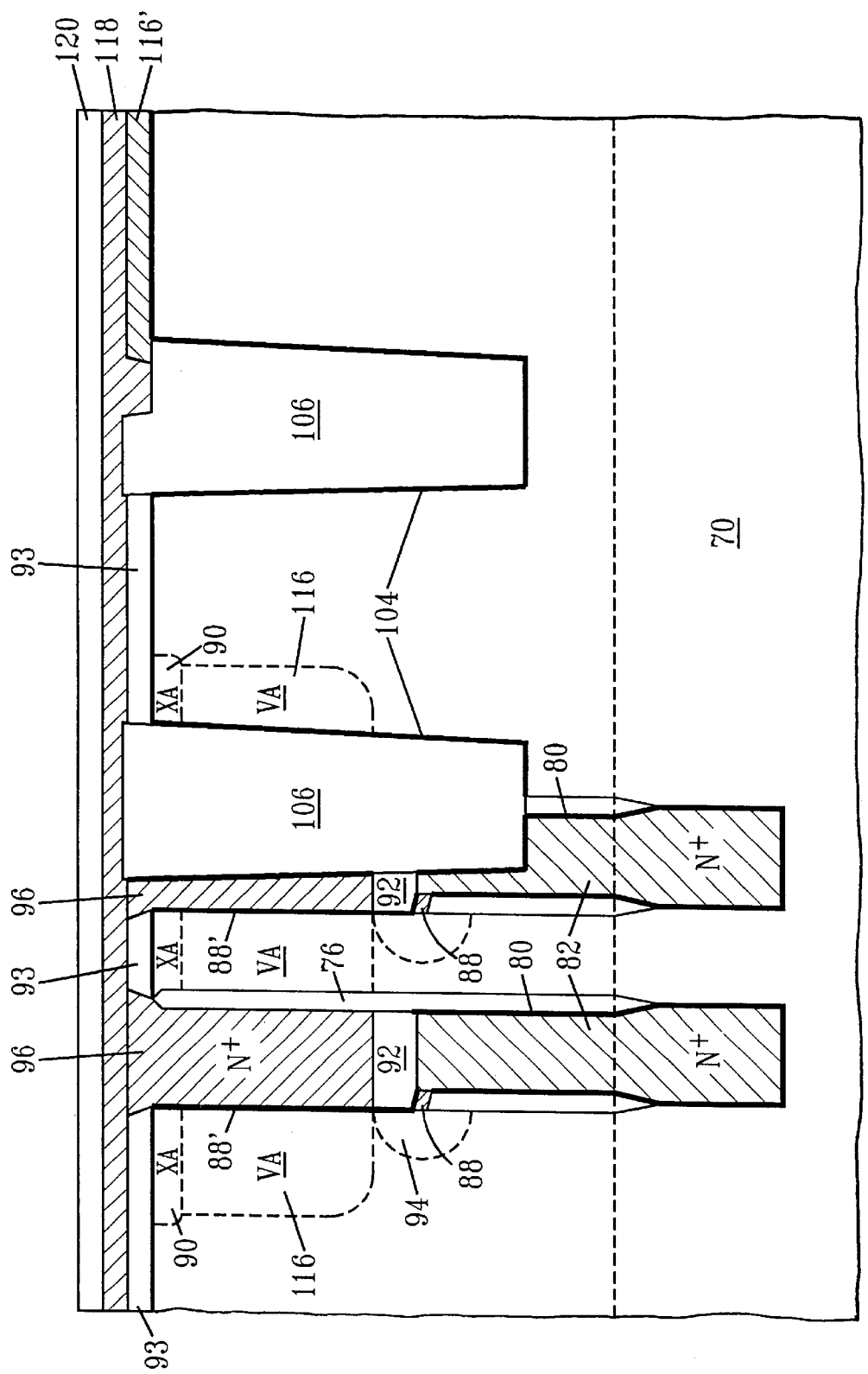

Gate stack deposition may then carried out. Gate stack deposition may include first depositing a seed layer, such as intrinsic polysilicon followed by deposition of a layer of tungsten silicide ($WSi_x$,)or layers of tungsten nitride (WN) and tungsten (W). A layer of $Si_3N_4$ may then be formed on the tungsten silicide or tungsten nitride/tungsten layer. FIG. 9d illustrates seed layer 116, tungsten containing layer 118 and $Si_3N_4$ layer 120.

Figure 9E:
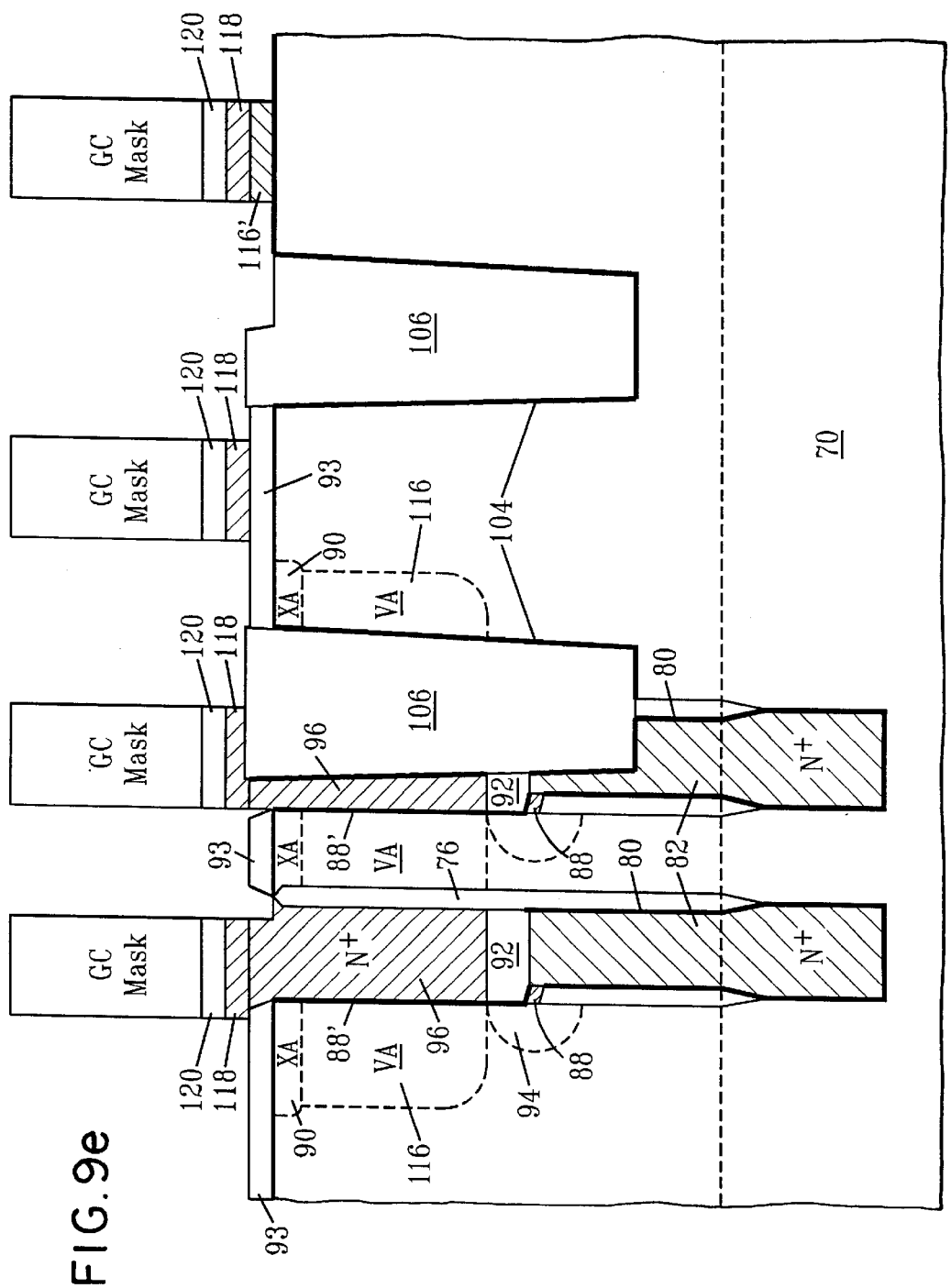

A gate conductor (GC) mask may be formed on selected regions of the $Si_3N_4$ layer 120. The $Si_3N_4$, tungsten-containing layer 118, and seed layer may then be etched along with portions of polysilicon 112 and polysilicon regions 96 at the top of the deep trenches. FIG. 9e illustrates the resulting structure.

Figure 9F:
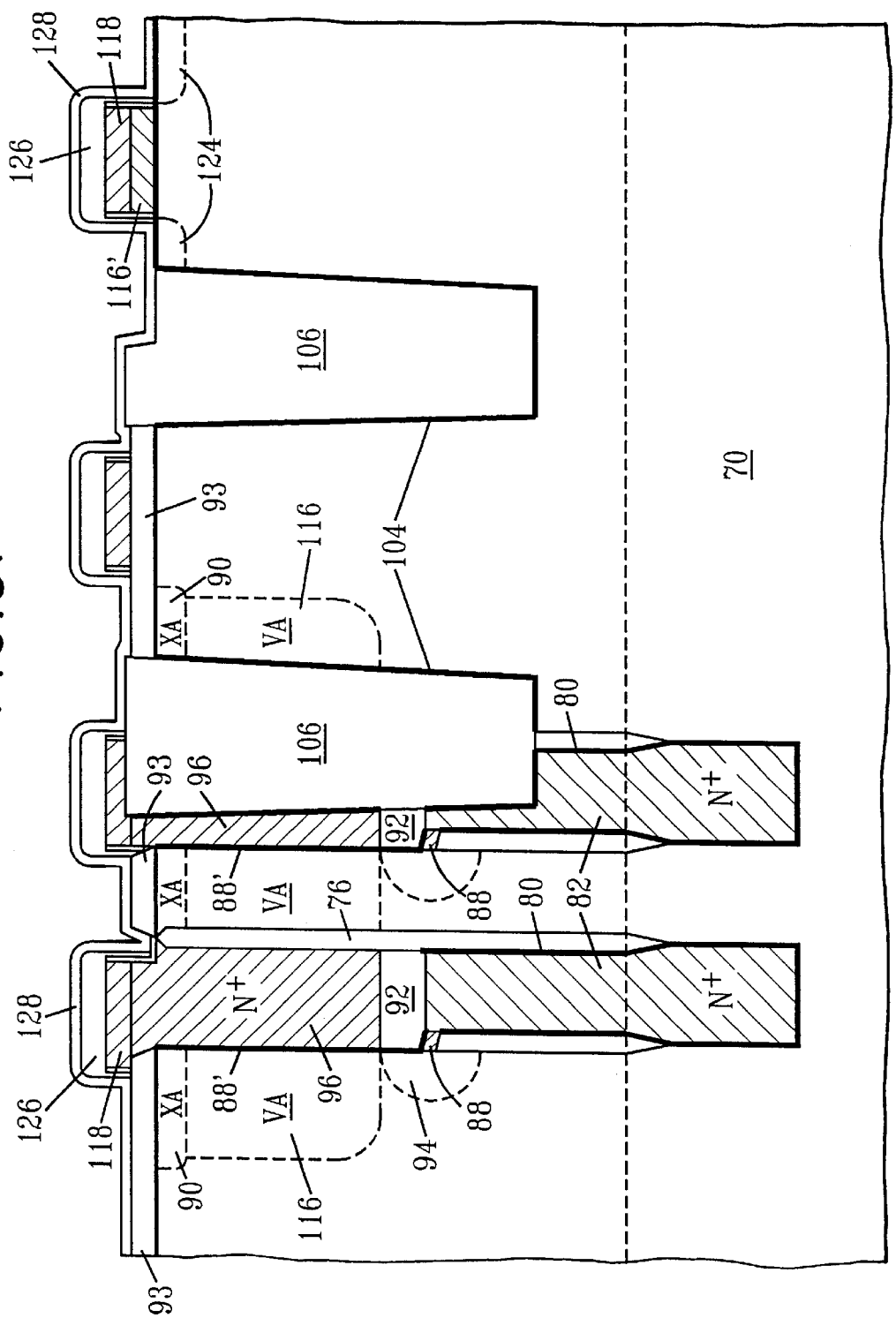

After etching, the gate conductor mask may be removed. Gate conductor sidewall oxidation may then be carried out to form a very thin, such as on the order of about 5 nm, oxide layer on the polysilicon, tungsten silicide or tungsten sidewalls. Junction implants 124 may be formed in the substrate. Nitride spacer and nitride liner regions 126 and 128 may also be formed. The resulting structure is illustrated in FIG. 9f.

Figure 10A:
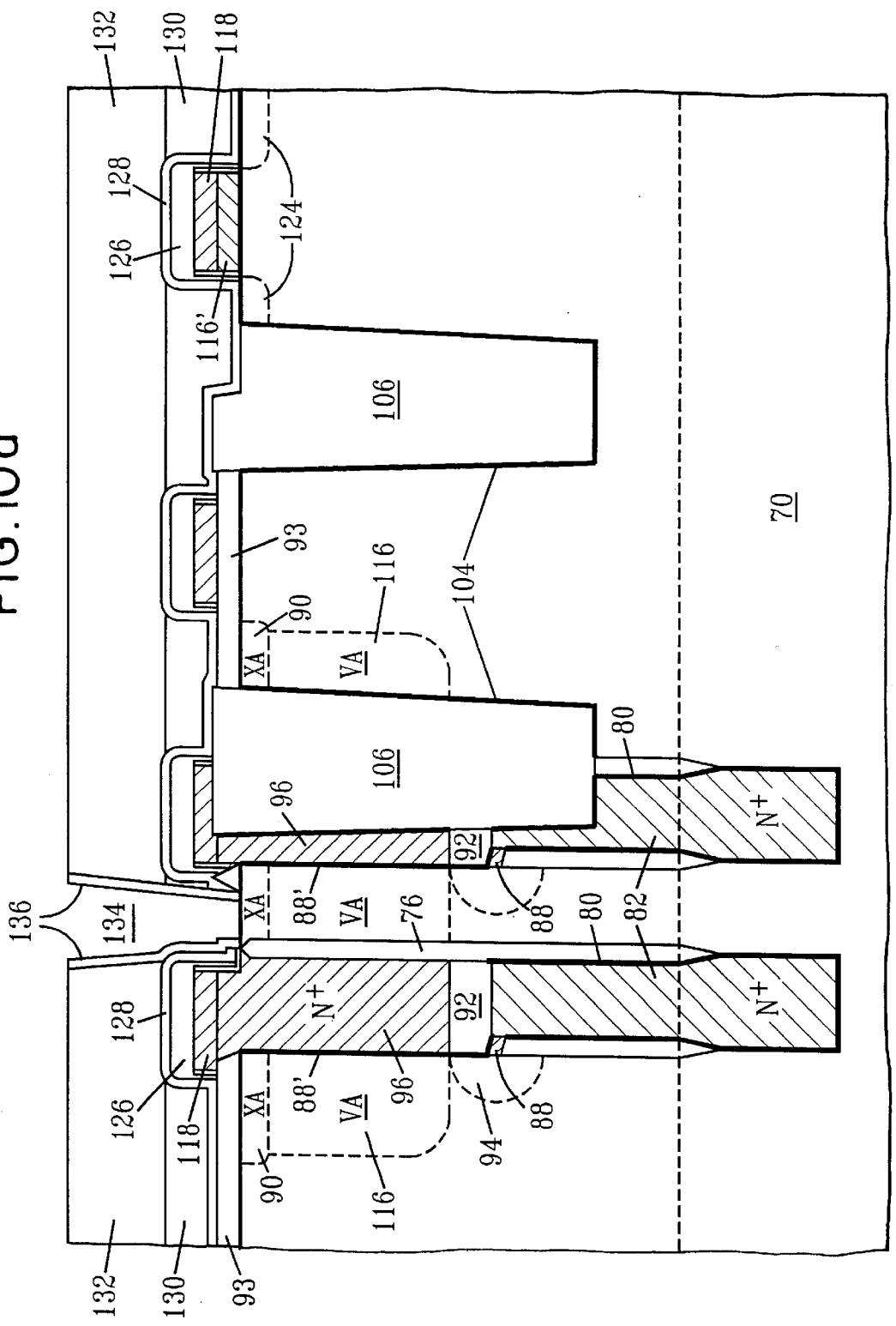

Next, BPSG may be deposited and planarized resulting in BPSG regions 130. Then TEOS layer 132 may be deposited. Next, a contact-to-bitline (CB) mask opening may be provided on TEOS layer 132 and CB via region 134 etched through TEOS layer 132 and BPSG layer 130. The CB mask may then be removed. CB spacer regions 136 may then be formed on the sidewalls of the CB via region 134. The CB mask may then be removed. FIG. 10a illustrates the resulting structure.

Figure 10B:
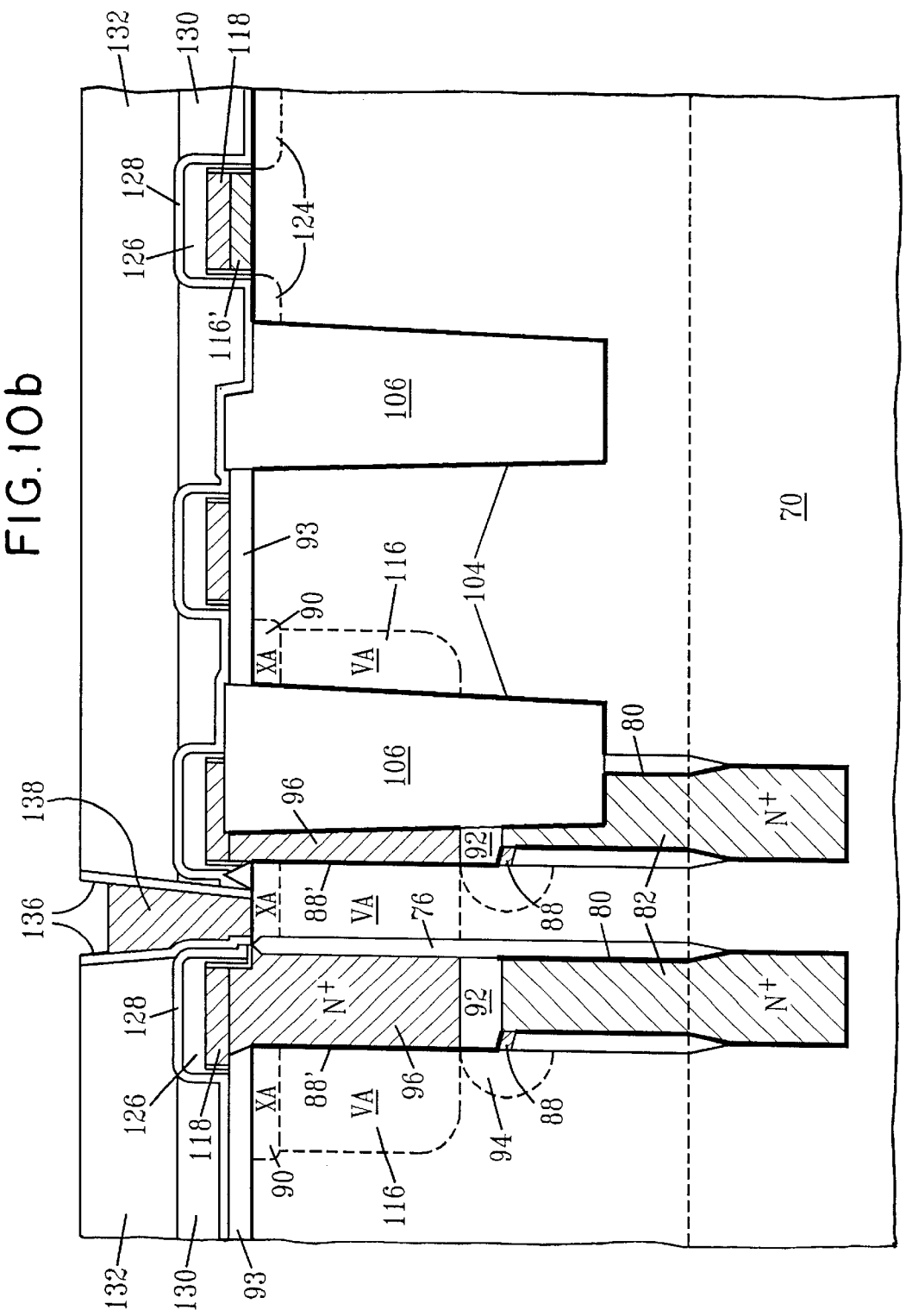

The CB region 134 may then be filled with polysilicon. The polysilicon layer is planarized and a portion of the polysilicon in the CB region 34 is recessed to result in CB poly region 138 as illustrated in FIG. 10b.

Figure 10C:
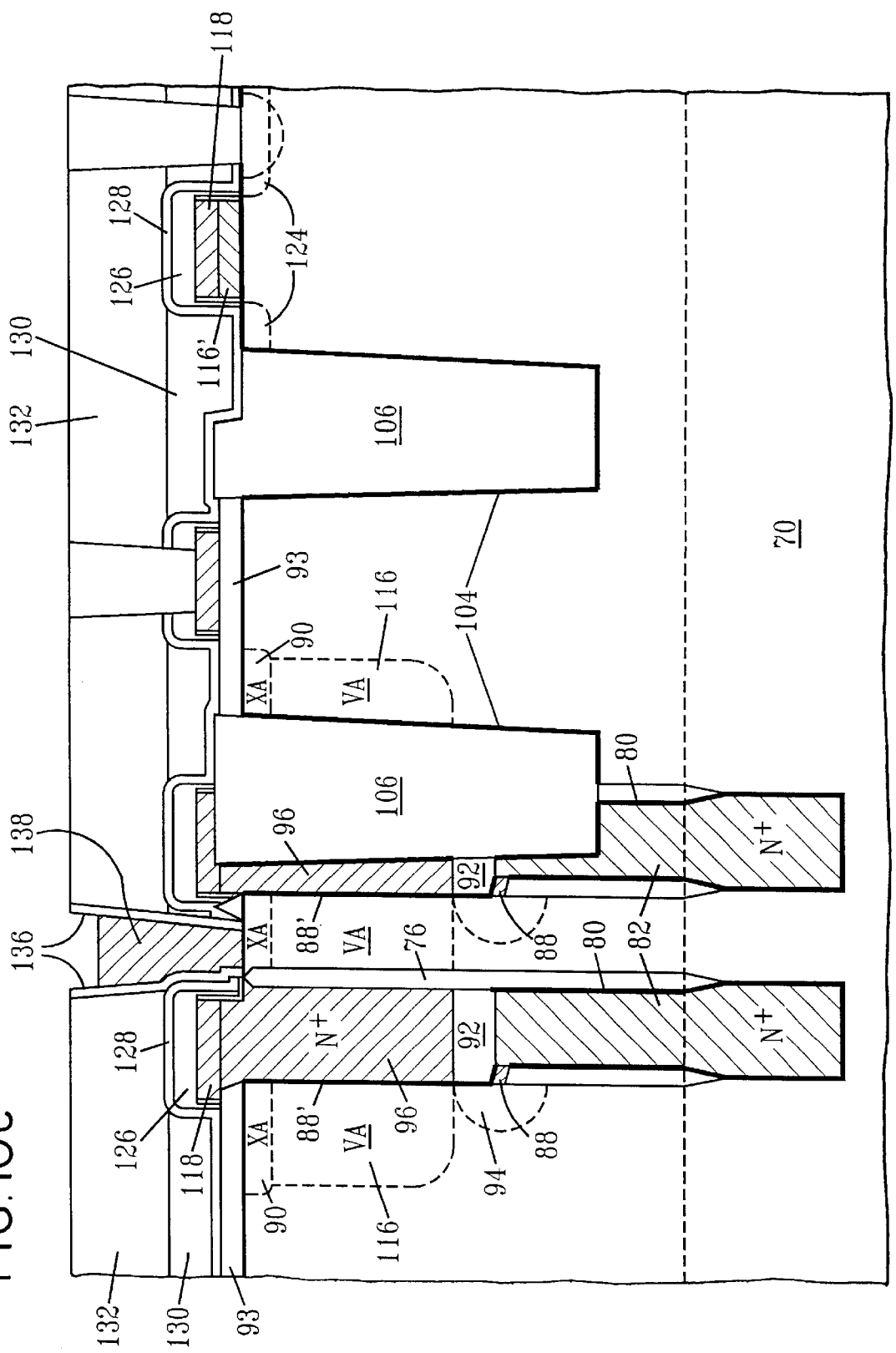
Figure 10D:
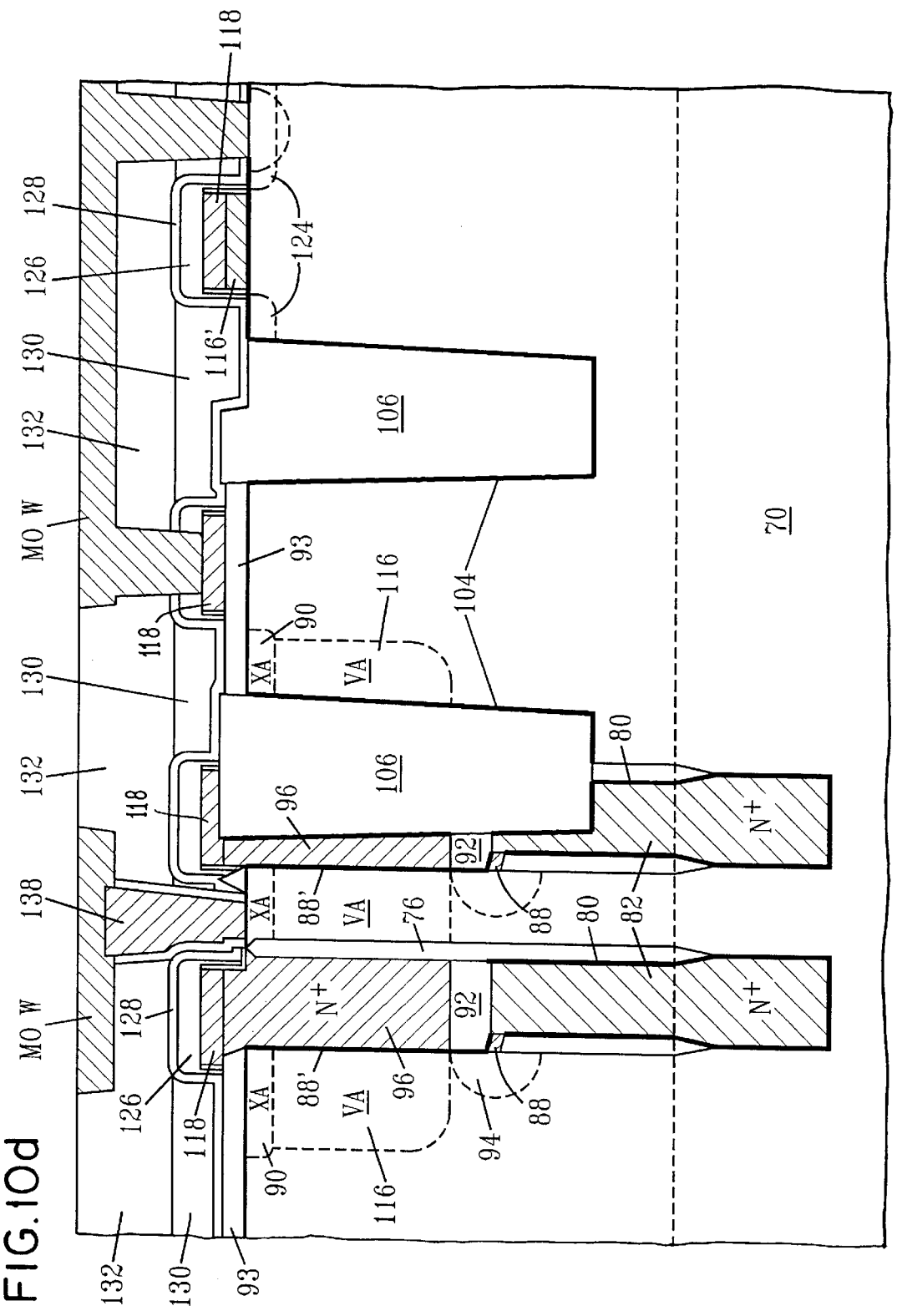

A contact-to-support (CS) diffusion mask may be deposited on TEOS layer 132 and portions of the TEOS layer etched. Then, a YN mask may be deposited and implants carried out. YN being one of the implants for forming a portion of the support NFET source/drains. Next, a YP mask may be deposited in implants carried out. The YP region is a P+ implant that forms a portion of the support PFET source/drain diffusion. The resulting structure is illustrated in FIG. 10c.

After carrying the YN and YP implants, a metal level (MO) mask may be deposited and portions of the TEOS layer 132 etched. Metal may then be deposited in and about the etched regions. Any suitable metal may be utilized. According to one embodiment, tungsten is utilized. The metal may then planarized to result in the structure illustrated in FIG. 10d.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A memory cell structure, comprising:
   a planar semiconductor substrate;
   a deep trench in the semiconductor substrate, the deep trench having a plurality of side walls and a bottom;
   a storage capacitor at the bottom of the deep trench;
   a vertical transistor extending down one side wall of the deep trench above the storage capacitor, the transistor having a source diffusion extending in the plane of the substrate adjacent the deep trench;
   a collar oxide extending down another side wall of the deep trench opposite the vertical transistor;
   shallow trench isolation regions extending along a surface of the substrate in a direction transverse to the sidewall where the vertical transistor extends;
   a gate conductor extending within the deep trench;
   a wordline extending over the deep trench and connected to the gate conductor; and
   a bitline extending above the surface plane of the substrate having a contact to the source diffusion between the shallow trench isolation regions.

2. The memory cell structure according to claim 1, wherein the memory cell has a pitch in a direction of the bitline of about three times or less a minimum structure dimension for the memory cell and a pitch in a direction of the wordline about two times or less a minimum structure dimension for the memory cell.

3. The memory cell structure according to claim 1, wherein the memory cell has a pitch in a direction of the bitline different than a pitch in a direction of the wordline.

4. The memory cell structure according to claim 1, comprising a plurality of memory cell structures and one bitline contact for each of one memory cell.

5. The memory cell structure according to claim 1, wherein the wordline is offset from the gate conductor.

6. The memory cell structure according to claim 2, wherein the minimum structure dimension of about 100 nm.

7. The memory cell structure according to claim 1, wherein the memory cell has an area of about $6F^2$ or less, wherein F is the minimum structure dimension of the memory cell.

8. The memory cell structure according to claim 1, wherein the wordline provides a wordline conductor and an isolation cut for the strap and gate conductor.

9. The memory cell according to claim 1, wherein the deep trench has dimensions of about two times a minimum structure dimension of the memory cell by about one times the minimum structure dimension of the memory cell.

10. The memory cell according to claim 1, comprising one memory cell per active silicon region.

11. The memory cell according to claim 1, wherein the shallow trench isolation regions have a width about two times a minimum structure dimension for the memory cell.

12. The memory cell according to claim 1, wherein an active area of the memory cell is provided by shallow trench isolation regions being adjacent the deep trench and by the collar oxide extending down the trench sidewall opposite the vertical transistor.

13. The memory cell according to claim 1, comprising a plurality of the memory cells and one bitline contact for each memory cell.

14. The memory cell according to claim 1, further comprising:
   a buried strap along one sidewall of the deep trench.

15. A memory array having a plurality of memory cell structures as recited in claim 1, where F is the feature size, the memory array comprising a 6F2 cell being made from the plurality of memory cell structures, and having a 3F bitline pitch, and a 2F wordline pitch; wherein the shallow trench isolation regions are parallel to the bitlines, each shallow trench isolation region is 2F wide, each trench has a single-sided buried strap connecting a corresponding vertical transistor to a corresponding storage capacitor, and each shallow trench isolation region cuts the strap on two sides.

* * * * *